United States Patent
Eguchi

(10) Patent No.: US 10,209,895 B2
(45) Date of Patent: Feb. 19, 2019

(54) MEMORY SYSTEM

(71) Applicant: Toshiba Memory Corporation, Minato-ku, Tokyo (JP)

(72) Inventor: Yasuyuki Eguchi, Kawasaki Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 55 days.

(21) Appl. No.: 15/261,580

(22) Filed: Sep. 9, 2016

(65) Prior Publication Data

US 2017/0242585 A1    Aug. 24, 2017

Related U.S. Application Data

(60) Provisional application No. 62/296,932, filed on Feb. 18, 2016.

(51) Int. Cl.
| | |
|---|---|
| G06F 3/06 | (2006.01) |
| H03M 13/15 | (2006.01) |
| H03M 13/19 | (2006.01) |
| H03M 13/29 | (2006.01) |
| G06F 11/10 | (2006.01) |

(52) U.S. Cl.
CPC ............. *G06F 3/061* (2013.01); *G06F 3/064* (2013.01); *G06F 3/0619* (2013.01); *G06F 3/0659* (2013.01); *G06F 3/0679* (2013.01); *G06F 11/106* (2013.01); *H03M 13/152* (2013.01); *H03M 13/19* (2013.01); *H03M 13/2906* (2013.01); *H03M 13/2927* (2013.01)

(58) Field of Classification Search
CPC ............. G06F 11/1076; G06F 11/1008; G06F 11/1004; G06F 3/061; G06F 11/106; G06F 3/0679; G06F 3/0659; G06F 3/0619; G06F 3/064; H05K 999/99; G11B 20/1833; H03M 13/2927; H03M 13/152; H03M 13/2906; H03M 13/19
USPC .......................................................... 714/766
See application file for complete search history.

(56) References Cited

U.S. PATENT DOCUMENTS

| | | | | |
|---|---|---|---|---|
| 5,617,551 A | * | 4/1997 | Corder | ................. G11C 11/406 365/222 |
| 2004/0111553 A1 | * | 6/2004 | Conley | .............. G06F 12/0246 711/103 |

(Continued)

FOREIGN PATENT DOCUMENTS

JP    2000322327 A    11/2000

*Primary Examiner* — Albert Decady
*Assistant Examiner* — Enam Ahmed
(74) *Attorney, Agent, or Firm* — Holtz, Holtz & Volek PC

(57) ABSTRACT

According to one embodiment, a memory system is provided with a memory cell array, a first command issuing circuit and a controller. The memory cell array includes a plurality of data areas and a plurality of first parity areas. The data areas are arranged in a plurality of banks or in a plurality of chips, and individually store a plurality of data portions constituting access-unit data. The first parity areas are adjacent to the data areas and individually store a plurality of first parity portions constituting the first parity corresponding to the data. The first command issuing circuit issues a first command for the data areas and the first parity areas. The controller accesses the data areas and the first parity areas in response to the first command.

14 Claims, 18 Drawing Sheets

(56) References Cited

U.S. PATENT DOCUMENTS

| | | | |
|---|---|---|---|
| 2004/0223366 A1* | 11/2004 | Miura | G11C 5/02 |
| | | | 365/154 |
| 2005/0286330 A1* | 12/2005 | Ito | G11C 11/406 |
| | | | 365/222 |
| 2007/0070799 A1* | 3/2007 | Sunaga | G11C 7/1078 |
| | | | 365/189.17 |
| 2008/0301519 A1* | 12/2008 | Kawabata | G06F 11/1008 |
| | | | 714/755 |
| 2009/0210616 A1* | 8/2009 | Karamcheti | G11C 5/04 |
| | | | 711/105 |
| 2011/0231739 A1 | 9/2011 | Kim | |
| 2013/0132779 A1* | 5/2013 | Smith | G06F 11/1076 |
| | | | 714/42 |
| 2013/0336060 A1 | 12/2013 | Arakawa | |
| 2015/0380087 A1* | 12/2015 | Mittelholzer | G06F 11/1072 |
| | | | 714/766 |
| 2017/0124007 A1* | 5/2017 | Zehavi | G06F 13/1689 |

* cited by examiner

| command | symbol | CS | ACT | A17 | RAS/A16 | CAS/A15 | WE/A14 | BG&BA | A12/BC | A13 | A10/AP | A11, A0-9 |
|---|---|---|---|---|---|---|---|---|---|---|---|---|
| Read data | RD | L | H | H | H | L | H | BG | V | H | L | CA |
| Read parity | RDP | L | H | H | H | L | H | BG | V | H | L | PA |
| Read data with Parity1 | RDP1 | L | H | L | H | L | H | BG | V | H | L | CA |
| Read data with Parity2 | RDP2 | L | H | H | H | L | H | BG | V | L | L | CA |
| Write data | WR | L | H | H | H | L | L | BG | V | H | L | CA |
| Write parity | WRP | L | H | H | H | L | L | BG | V | H | L | PA |
| Write data With Parity1 | WRP1 | L | H | L | H | L | L | BG | V | H | L | CA |
| Write data With Parity2 | WRP2 | L | H | H | H | L | L | BG | V | L | L | CA |

FIG. 1

| A[n:n+2] | RDP1/WRP1 |
|---|---|
| 000 | 8 data+1 parity1 |
| 001 | 16 data+2 parity1 |
| 010 | 32 data+4 parity1 |
| 011 | 64 data+4 parity1 |
| 100-110 | RFU |
| 111 | 512 data+64 parity1 |

206A

| A[n:n+2] | RDP2/WRP2 |
|---|---|
| 000-011 | RFU |
| 100 | 512 data+64 parity1+52 parity2 |
| 101 | 32 data+4 parity1+4 parity2 |
| 110 | 64 data+8 parity1+7 parity2 |
| 111 | 128 data+8 parity1+7 parity2 |

206B

Mode register
206

F I G. 2

| Parity | Information length | Parity length | Error correction capability | ECC method |
|---|---|---|---|---|
| ECC1 | parity 1 | 64 bits (8 bits x 8) | 8 bits (1bit x 8) | 1 bit | Hamming |
| ECC2 | parity 2 | 4,096 bits (512 bits x 8) | 416 bits | 32 bits | BCH |

F I G. 3

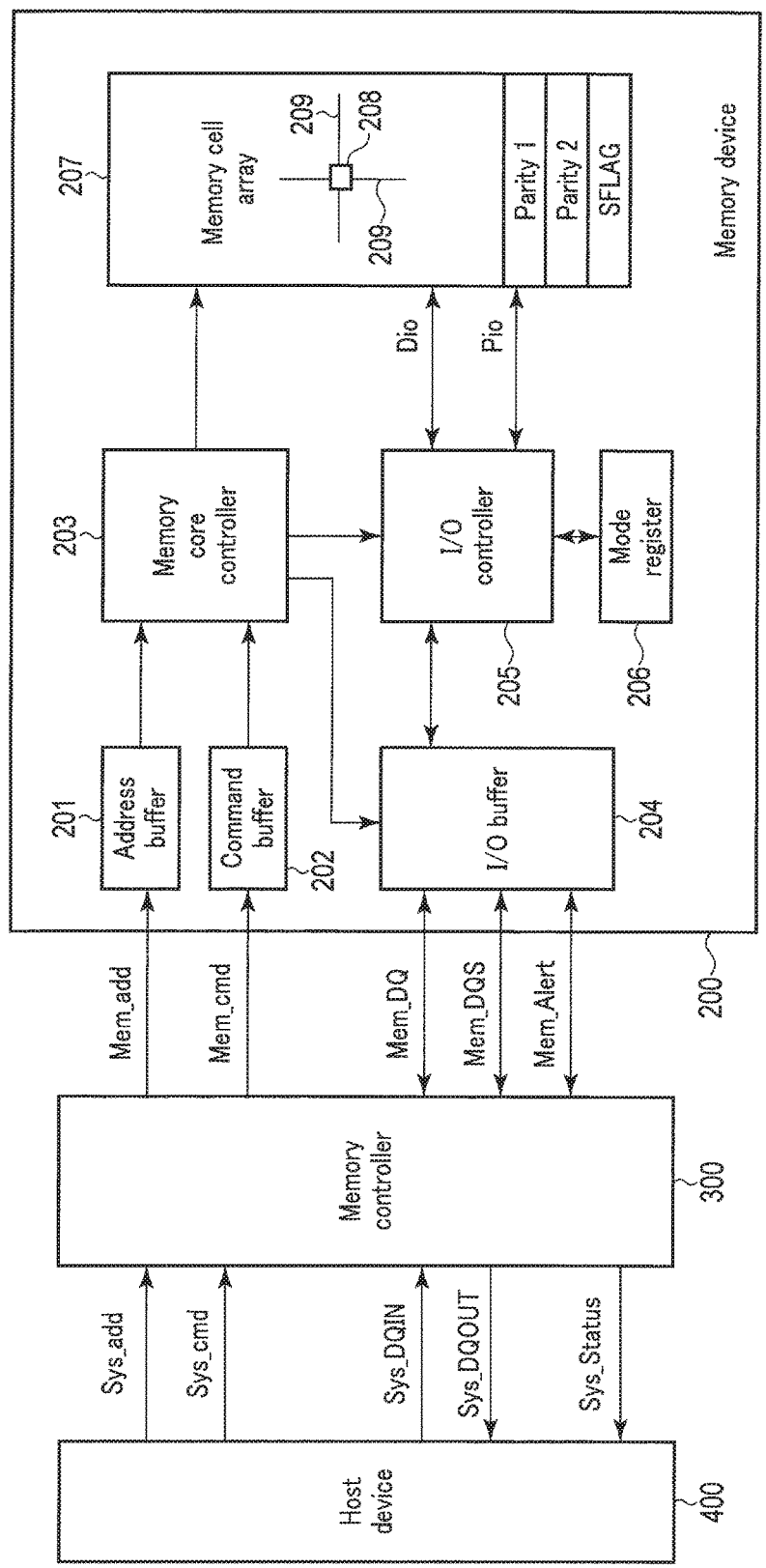
F I G. 5

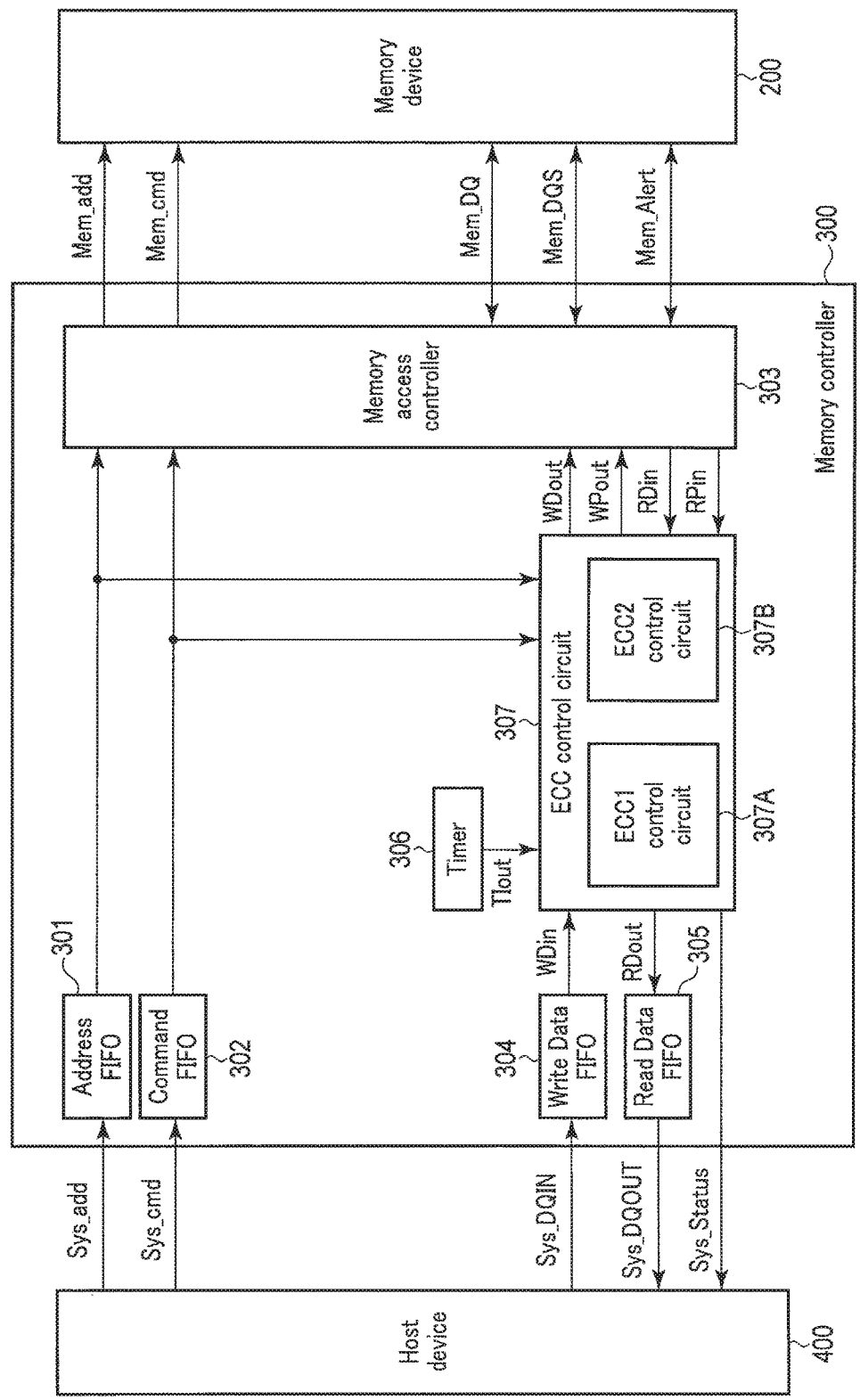
F I G. 6

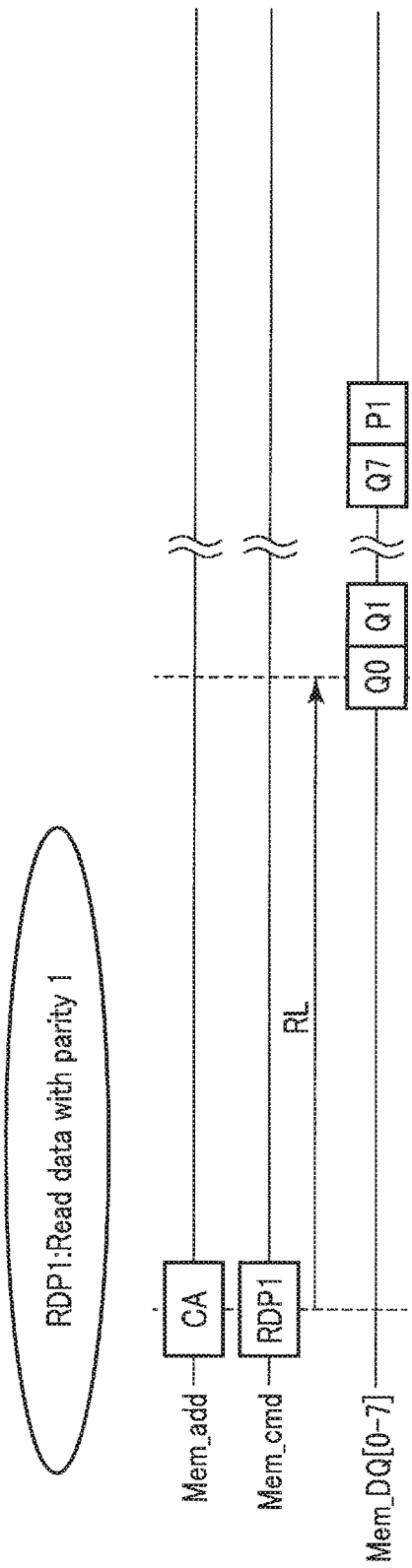
F I G. 8

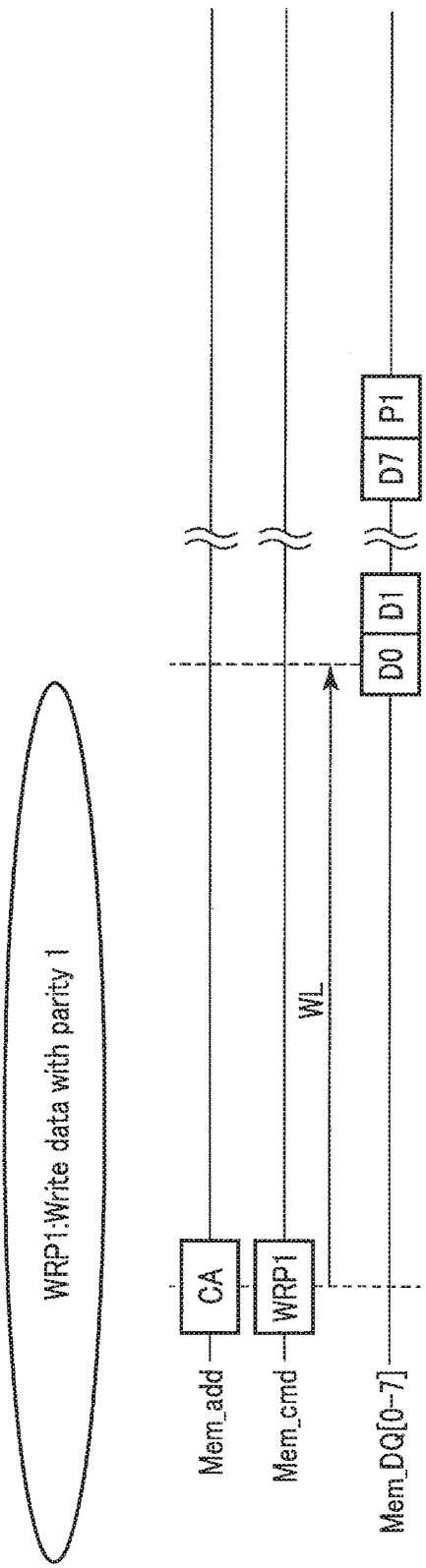
F I G. 11

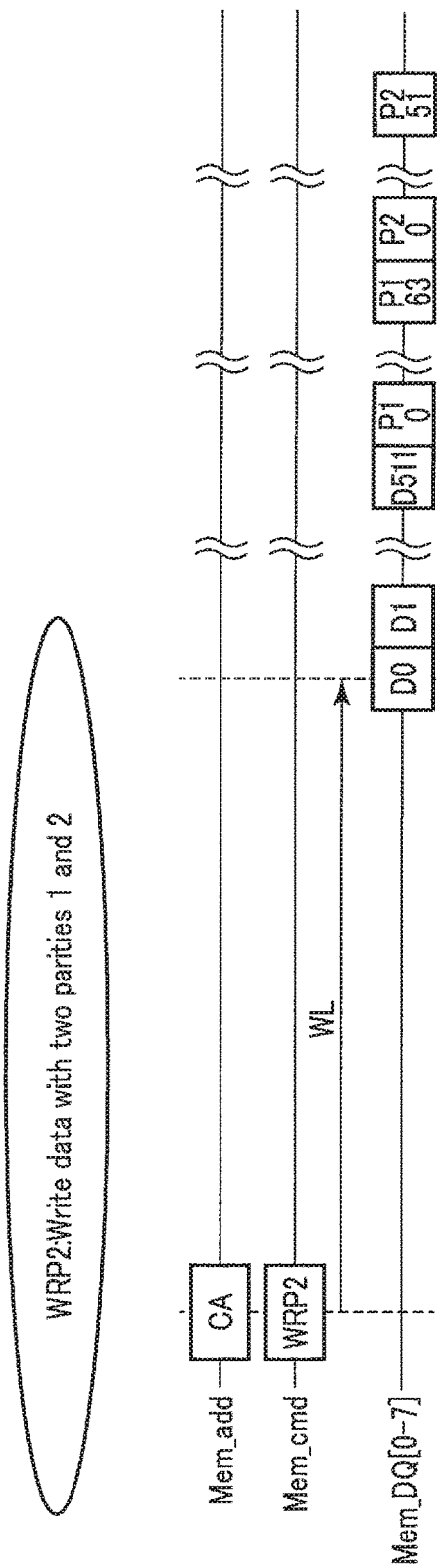
F I G. 12

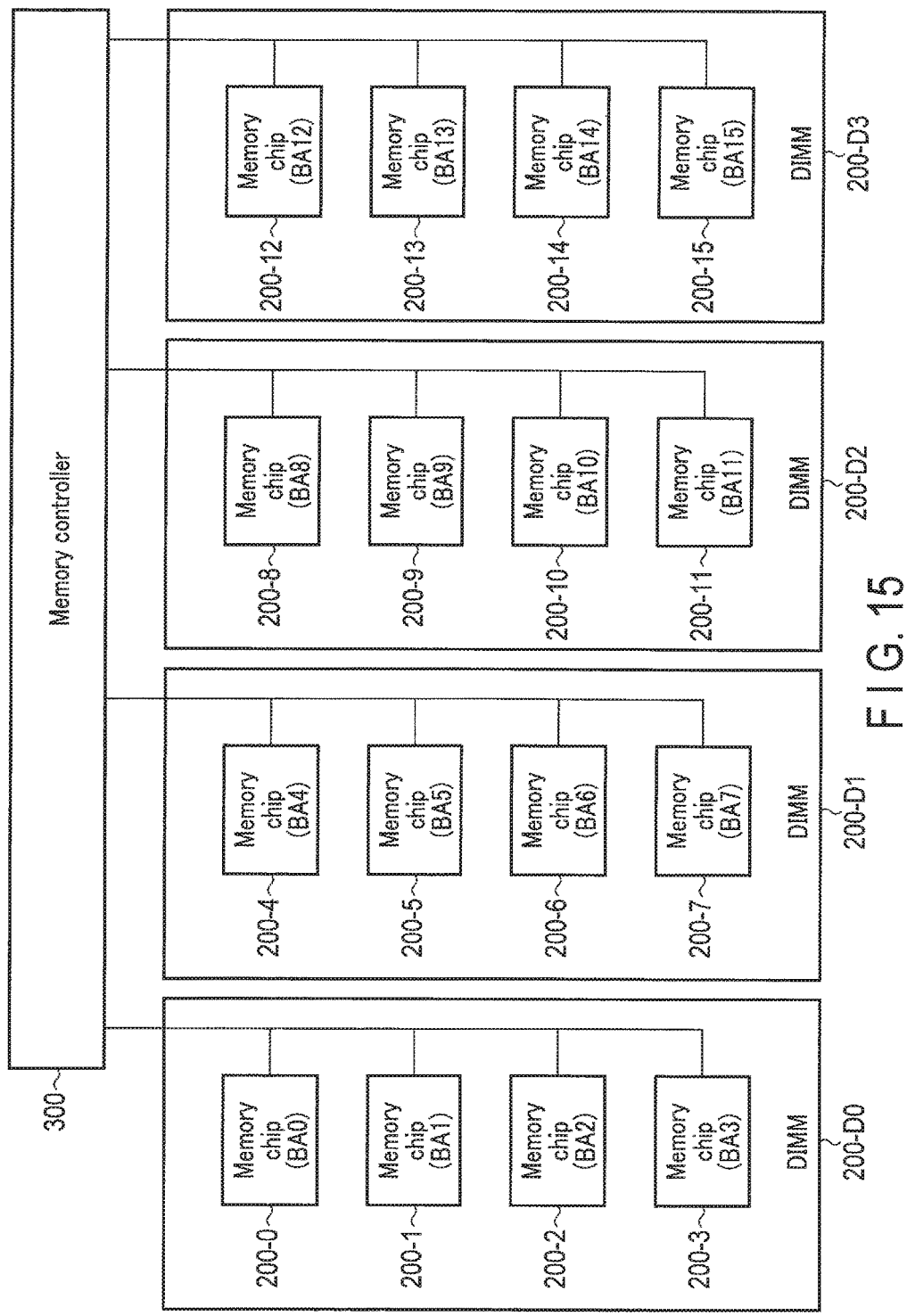
F I G. 15

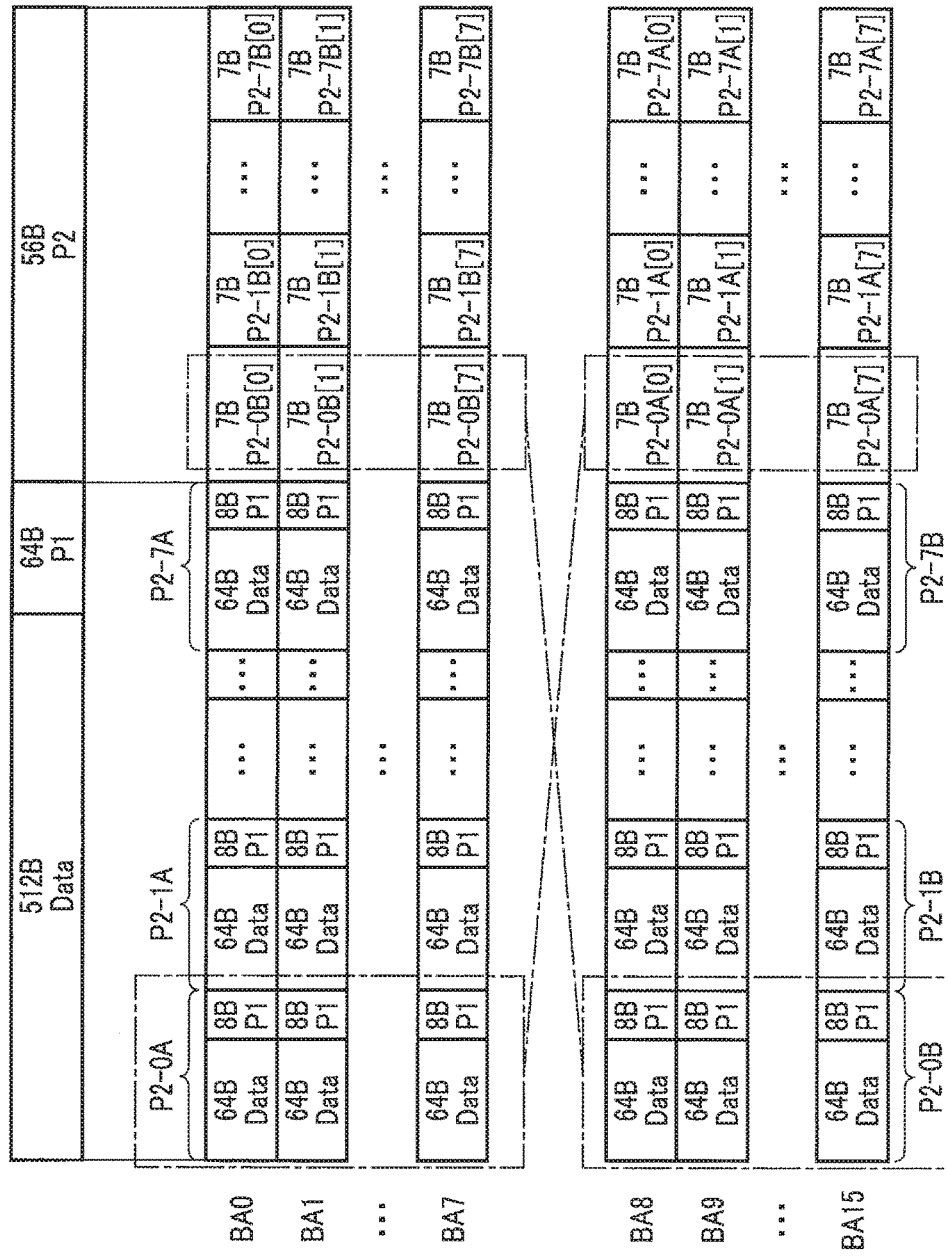
F I G. 16

MEMORY SYSTEM

CROSS-REFERENCE TO RELATED APPLICATIONS

This application is based upon and claims the benefit of U.S. Provisional Application No. 62/296,932, filed on Feb. 18, 2016, the entire contents of which are incorporated herein by reference.

FIELD

Embodiments described herein relate generally to a memory system.

BACKGROUND

A memory system that performs error correction is known in the art.

BRIEF DESCRIPTION OF THE DRAWINGS

FIG. 1 is a schematic diagram illustrating a command truth table used in each embodiment.

FIG. 2 is a schematic diagram illustrating setting information used in each embodiment.

FIG. 3 is a schematic diagram illustrating ECC methods used in each embodiment.

FIG. 5 is a schematic diagram illustrating a configuration of a memory device according to the first embodiment.

FIG. 6 is a schematic diagram illustrating a configuration of a memory controller according to the first embodiment.

FIG. 8 is a timing chart illustrating how a read operation is performed in response to an RDP1 command in the first embodiment.

FIG. 11 is a timing chart illustrating how a write operation is performed in response to a WRP1 command in the first embodiment.

FIG. 12 is a timing chart illustrating how a write operation is performed in response to a WRP2 command in the first embodiment.

FIG. 15 is a schematic diagram illustrating a data structure obtained by further modifying the data structure of the first modification.

FIG. 16 is a schematic diagram illustrating a data structure according to the second modification of the first embodiment.

DETAILED DESCRIPTION

Figure 4:
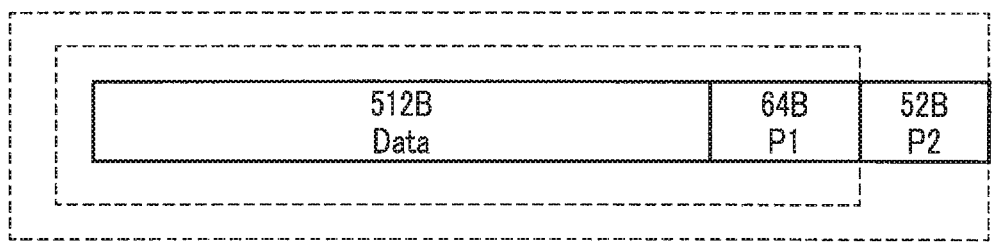
FIG. 4 is a schematic diagram illustrating how a data structure is in each embodiment.

In general, according to one embodiment, a memory system comprises a memory cell array, a first command issuing circuit and a controller. The memory cell array includes a plurality of data areas and a plurality of first parity areas. The data areas are arranged in a plurality of banks or in a plurality of chips, and individually store a plurality of data portions constituting access-unit data. The first parity areas are adjacent to the data areas and individually store a plurality of first parity portions constituting the first parity corresponding to the data. The first command issuing circuit issues a first command for the data areas and the first parity areas. The controller accesses the data areas and the first parity areas in response to the first command.

Before the embodiments are described with reference to the drawings, features common the embodiments will be described. In the description below, structural elements having substantially the same functions and configurations will be denoted by the same reference symbols, and a repetitive description will be given only where necessary. The drawings are schematic. Each of the embodiments merely shows an exemplary apparatus and method that implement the technical ideas of the embodiments. The technical ideas of the embodiments are not limited to the error correction code (ECC) systems, element materials, shapes, structures, arrangements etc. described below. The descriptions of one embodiment are all applicable to the other embodiments, unless such application is excluded explicitly or obviously.

Each of the function blocks shown in the Figures can be implemented in the form of hardware, computer software or a combination of them. In order to clarify what are specifically meant by the function blocks, the function blocks will be explained below in terms of their functions. The functional blocks need not be those depicted in the Figures. For example, part of the functions of one exemplary function block may be implemented by another functional block. In addition, an exemplary function block may be divided into more specific function blocks. The embodiments are not limited by which function block a function is attained. The order of the steps of the control flows shown in the Figures can be changed unless such change is denied explicitly or obviously.

In connection with the embodiments described below, an MRAM (Magnetic Random Access Memory) will be referred to as an example of memory device. Needless to say, the memory device is not limited to this and may be a DRAM or another type of memory or storage.

<Outline of Features Common to Each Embodiment>

[0-1] Outline

The embodiments are featured by the configurations they have for reducing the number of times commands are issued. Such configurations include a new command regarding data or parities, a command truth table for defining the new command, and setting information regarding data size and parity size. It should be noted that the command truth table and the setting information are not essential but can be omitted by using a dedicated command, for example. A description will be given of the features common to the embodiments.

[0-2] New Command

In general, access to a data area and a parity area is enabled by entering addresses corresponding to the areas and a read/write command. It is assumed here that "BL" stands for the byte length of information that is read or written at a time in response to a single read/write command. Where the setting is BL=n, information of n bytes (nB) is read or written at a time. For example, where 512 B data, 64 B parity 1 and 52 B parity 2 are accessed, the setting "BL=8" generally requires issuing a command 79 times. For this reason, a command band width, which corresponds to the number of times a command can be entered within one second, may be a bottleneck, deteriorating the performance.

The embodiments are therefore featured by providing at least one of (a) to (c), in addition to a read/write command for accessing a data area.

(a) a single read or write command for accessing the data area and the parity area;

(b) a single read or write command for accessing the data area and the parity areas of some kinds of parities; and (c) setting information, provided in addition to the command (a) or (b), for setting how the size of the data area and the size of the parity area are to be combined with each other.

As can be understood from the above, the embodiments access both the data area and the parity area in response to a single read/write command, thereby reducing the number of times a command is issued and decreasing the usage rate of the command bus. Accordingly, the embodiments prevent the performance degradation due to the limited command band width. In addition, the embodiments may enable access to data of large size, such as 512 B and 4 KB. The parity data used then may be assigned to the data of the same page address or to the data of different banks or I/O terminals.

[0-3] Command Truth Table

The single command (a) or (b) described above may be defined in a command truth table, as in an example shown in FIG. 1. The single command used herein includes a plurality of signals having specific patterns shown in the command truth table. For example, the signals include a write enable signal, a column address signal, a signal appearing at pin A17 that is not used before (the signal will be referred to as a "first unused signal"), and a signal appearing at pin A13 that is not used before (the signal will be referred to as a "second unused signal"). The signals may include a parity address signal, in place of the column address signal. In either case, the command truth table uses the first unused signal and the second unused signal, for providing a new command. The first unused signal and the second unused signal are portions of the specific patterns shown in the command truth table, but are not used for any other purpose. The command truth table has a table format of 9 rows and 13 columns. In the first row, the item names of the 13 columns are indicated. The item names of the first and second columns from the left are a command name and a command symbol, respectively. The item names of the third to 13th columns from the left (namely, "CS", "ACT", . . . , "A11,A0-9") represents the names of the pins of the memory device and the signals appearing at the pins. In the command truth table shown in FIG. 1, only the commands related to the read and write operations are shown, and the commands related to other operations, such as active, precharge, refresh, etc., are not shown.

The "CS" means a chip select signal (referred to as CS signal as well) at a CS pin. The CS signal is supplied to the memory device as command Mem_cmd from the memory controller.

The "ACT" means an active command signal (referred to as an ACT signal as well) at an ACT pin. The ACT signal is supplied to the memory device as command Mem_cmd from the memory controller.

The "A17" means an input signal (referred to as an A17 signal as well) at pin A17. The A11 signal is supplied to the memory device as address Mem_add from the memory controller.

The "RAS/A16" means a row address strobe signal (referred to as a RAS/A16 signal) at pin A16. The RAS A16 signal is supplied to the memory device as address Mem_add and command Mem_cmd from the memory controller.

The "CAS/A15" means a column address strobe signal (referred to as a CAS/A15 signal) at pin A15. The CAS/A15 signal is supplied to the memory device as address Mem_add and command Mem_cmd from the memory controller.

The "WE/A14" means a write enable signal (referred to as a WE/A14 signal as well) at pin A14. The WE/A14 signal is supplied to the memory device as address Mem_add and command Mem_cmd from the memory controller.

The "BG&BA" means a bank group & bank address signal (referred to as a BG&BA signal as well) at a GB&GA pin. In FIG. 1, the BG&BA signal is shown as being in the state "BG." This means that a bank group (bank address) signal is supplied. The BG&BA signal is supplied to the memory device as address Mem_add from the memory controller.

The "A12/BC" means a burst chop signal (referred to as an A12/BC signal as well) at pin A13. In FIG. 1, the "A14/BC" signal is shown as being in the state "V." This means that the input signal is valid. If the "A12/BC" signal is shown as being in the state "H", this means that the burst chop is valid. If "A12/BC" signal is shown as being in the state "L", this means that the burst chop is invalid. The A12/BC signal is supplied to the memory device as command Mem_cmd and address Mem_add from the memory controller.

The "A13" means an input signal (referred to as an A13 signal as well) at pin A13. The A13 signal is supplied to the memory device as address Mem_add from the memory controller.

The "A10/AP" means an auto precharge signal (referred to as an A10/AP signal as well) at pin A10. The command truth table in FIG. 1 illustrates the case where the auto precharge is invalid, and does not show any command wherein the auto precharge is valid. It should be noted that the present embodiment does not specify that the auto precharge function is invalid. The A10/AP signal is supplied to the memory device as command Mem_cmd and address Mem_add from the memory controller.

The "A11,A0-9" means input signals (referred to as "A11,A0-9" signals as well) at pin A11 and pins A0-A9. The "A11,A0-9" signals designate a position in a memory space expressed in 11 bits. In FIG. 1, the "A11,A0-9" signals are shown as having a value of PA or CA. PA indicates a column address used for designating the position where a parity is stored, while CA indicates a column address used for indicating the position where data is stored. PA is an abbreviation for "parity address." CA is an abbreviation for "column address." The "A11,A0-9" signals are supplied to the memory device as address Mem_add from the memory controller.

The second to ninth rows show the states of the signals of each command or symbol (specific patterns). For example, "H" and "L" in FIG. 1 represent logical levels of the signals. The commands differ from each other in terms of how the states of the WE/A14 signal, the "A11,A0-9" signals, the A17 signal and the A13 signal are combined. In the command truth table, the A13 signal and the A17 signal are additionally used to provide new commands.

The command shown in the second row is "Read data", and the symbol for the command is "RD." In the "Read data" command (referred to as an RD command as well), the WE/A14 signal is "H", and the other signals are in the states shown in the second row. In the RD command, A13=A17=H.

The command shown in the third row is "Read parity", and the symbol for this command is "RPD." In the Read parity command (referred to as an RDP command as well), the signals are the same as those of the RD command, except that the value of the "A11,A0-9" signals is PA (parity address). In other words, the RDP command is the same as the RD command, except that the parity address (PA), representing the parity to be accessed, is described in place of the column address (CA). In the RDP command, A13=A17=H.

The command shown in the fourth row is "Read data with parity 1", and the symbol for this command is "RPD1." In the "Read data with parity 1" command (referred as an RDP1 command as well), the signals are the same as those of the RD command, except that the A17 signal is "L." In other words, the RDP1 command is the same as the RD command, except that A17=L and A13=H, and is intended to output predetermined parity 1 after the output of data. The "Read data with parity 1" and "RDP1" may be regarded as "Read data with one parity 1" and "RD1P", respectively.

The command shown in the fifth row is "Read data with parity 2", and the symbol for this command is "RPD2." In the "Read data with parity 2" command (referred to as an RDP2 command as well), the signals are the same as those of the RD command, except that the A13 signal is "L." In other words, the RDP2 command is the same as the RD command, except that A17=H and A13=L, and is intended to output predetermined two parities after the output of data. The "Read data with parity 2" and "RDP2" may be regarded "Read data with two parities" and "RD2P", respectively.

The command shown in the sixth row is "Write data", and the symbol for the command is "WR." In the "Write data" command (referred to as a WR command as well), the WE/A14 signal is "L", and the other signals are in the states shown in the sixth row. In the WR command, A13=A17=H.

The command shown in the seventh row is "Write parity", and the symbol for the command is "WRP." In the Write parity command. (referred to as a WRP command as well), the signals are the same as those of the WR command, except that the value of the "A11,A0-9" signals is PA (parity address). In other words, the WRP command is the same as the WR command, except that the parity address (PA), representing the parity to be accessed, is described in place of the column address (CA). In the WRP command, A13=A17=H.

The command shown in the eighth row is "Write data with parity 1", and the symbol for this command is "WRP1." In the "Write data with parity 1" command (referred to as a WRP1 command as well), the signals are the same as those of the WR command, except that the A17 signal is "L." In other words, the WRP1 command is the same as the WR command, except that A17=L and A13=H, and is intended to input predetermined parity 1 after the input of data. The "Write data with parity 1" and "WRP1" may be regarded "Write data with one parity" and "WR1P", respectively.

The command shown in the ninth row is "Write data with parity 2", and the symbol for this command is "WRP2." In the "Write data with parity 2" command (referred to as a WRP2 command as well), the signals are the same as those of the WR command, except that the A13 signal is "L." In other words, the WRP2 command is the same as the WR command, except that A17=H and A13=L, and is intended to input predetermined two parities after the input of data.

The "Write data with parity 2" and "WRP2" may be regarded "Write data with two parities" and "WR2P", respectively.

[0-4] Setting Information

The (a) to (c) will be reiterated.

(a) a single read or write command for accessing the data area and the parity area;

(b) a single read or write command for accessing the data area and the parity areas of some kinds of parities; and (c) setting information, provided in addition to the command (a) or (b), for setting how the size of the data area and the size of the parity area are combined with each other.

The setting information described in (c) can be defined in a mode register 206, as in the example shown in FIG. 2. The setting information includes first setting information 206A corresponding to command (a) set forth above and second setting information 206B corresponding to command (b) set forth above. Of the storage areas of the mode register 206, those used for storing the first setting information 206A may be referred to as a first tins information register. Likewise, of the storage areas of the mode register 206, those used for storing the second setting information 206B may be referred to as a second setting information register. Command (a) corresponds to the RDP1 command and WRP1 command. Command (b) corresponds to the RDP2 command and WRP2 command. The first setting information 206A includes a plurality of first combination information representing combinations between the size of the data area to be accessed by command (a) (first command) and the size of the first parity area, and a plurality of codes by which the respective first combination information are identified. The second setting information 206B includes a plurality of second combination information representing combinations between the size of the data area to be accessed by command (b) (second command) and the size of the second parity area, and a plurality of codes by which the respective second combination information are identified. The codes "000", . . . , "011" for identifying the setting information are stored in the RDP1/WRP1 register (first code register) of the mode register 206. The codes "100", . . . , "111" for identifying the second setting information are stored in the RDP2/WRP2 register (second code register) of the mode register 206. The RDP1/WRP1 register and the RDP2/WRP2 register are implemented using idle bits of the mode register. In FIG. 2, RFU is an abbreviation for "reserved for future use."

A code having a predetermined value is set in the RDP1/WRP1 register, and the first setting information 206A thereby enables access to data of predetermined size and parity 1 of predetermined size in response to a single command. For example, where A[n:n+2]=000 is set in the RDP1/WRP1 register, access to 8 B data and 1 B parity 1 is enabled in response to a single command.

A code having a predetermined value is set in the RDP2/WRP2 register, and the second setting information 206B thereby enables access to data of predetermined size and parity 2 of predetermined size in response to a single command. For example, where A[n:n+2]=100 is set in the RDP2/WRP2 register, access to 512 B data, 64 B parity 1 and 52 B parity 2 is enabled in response to a single command. Parities 1 and 2 are generated using different ECC methods, as shown in FIG. 3, for example. For example, the ECC1 method can use a Hamming code having an information length of 64 bits, a parity length of 8 bits and an error correction capability of 1 bit. For example, the ECC2 method can use a BCH (Bose-Chaudhuri-Hocquenghem) code having an information length of 4,096 bits, a parity length of 416 bits and an error correction capability of 32 bits.

The relation between parities 1 and 2 will be supplementarily described with reference to FIG. 4. FIG. 4 is a schematic diagram illustrating an example of how a data structure is when parity 2 is assigned to each page of a memory cell array. To be specific, FIG. 4 illustrates the relation between the data and the parities, as well as the positional relation between them. In the example shown in FIG. 4, 64 B parity 1 and 52 B parity 2 are assigned to 512 B data. In the example, the actual storage positions are reflected in the relation. That is, the 512 B data, 64 B parity 1 and 52 B parity 2 are arranged from a lower column address to an upper column address of one page. In this arrangement, the storage position of data can be designated by the lower CA designated by the "A11,A0-9" signals and storage positions of parities 1 and 2 can be designated by the upper PA designated by the "A11,A0-9" signals.

In the ECC1 method, 1 B parity 1 corresponds to 8 B data. That is, in the ECC1 method, 64 sets of data and parities are used for the 512 data.

512 B Data+64 B Parity 1=64 Sets (8 B Data+1 B Parity)

In the ECC2 method, 52 B parity 2 corresponds to (512 B+64 B) data. In the ECC2 method, the data and parities are structured as follows:

Data: 512 B Data+64 B Parity 1
Parity: 52 B Parity 2

A description will now be given of the first embodiment.

First Embodiment

<1-1> Configuration

A description will now be given with reference to FIGS. 5 and 6 as to how a memory device and a memory controller are configured in the memory system according to the first embodiment.

[1-1-1] Configuration of Memory Device

FIG. 5 is a schematic diagram illustrating how the memory device is configured in the memory system of the first embodiment. The memory device 200 is connected to a host device 400 via a memory controller 300. The memory device 200 and the memory controller 300 constitute a memory system.

The memory device 200 is a RAM and is fabricated as one semiconductor chip. The memory device 200 can be implemented as any type of RAM. The memory device 200 is configured to store data in a known method. To be specific, the memory device 200 can be a dynamic RAM (DRAM), a magnetoresistive RAM (MRAM), a resistive RAM (Re-RaM) or a phase change RAM (PCRAM). The first embodiment is not limited by the data storage method the memory device 200 uses. With respect to the memory device 200, features (including structural elements and connections) known to those skilled in the art differ, depending upon the types of RAMs. For this reason, FIG. 5 shows elements that, are generally included in a RAM. Depending upon the type of RAM, the memory device 200 may include function blocks different from those shown in FIG. 5, and the function blocks of the memory device 200 are not limited to those included in the example shown in FIG. 5.

The memory device 200 is connected to the memory controller 300 by connection lines so that the memory device 200 can communicate with the memory controller 300. The connection lines include, for example, a power supply line, a data bus and a command line. The memory controller 300 supplies commands to the memory device 200 and controls the memory device 200 with the commands. To be more specific, the memory controller 300 instructs the memory device 200 to write data therein, or instructs the memory device 200 to read specific data therefrom.

The memory device 200 includes an address buffer 201, a command buffer 202, a memory core controller 203, an I/O buffer 204, an I/O controller 205, a mode register 206 and a memory cell array 207. In the example shown in FIG. 5, the memory cell array 207 is fabricated in a first semiconductor chip. The memory access controller 303 and EGG control circuit of the memory controller 300, described later, are fabricated in a second semiconductor chip different from the first semiconductor chip.

The address buffer 201 temporarily stores address Mem_add supplied from the memory controller 300, and supplies this address to the memory core controller 203. The command buffer 202 temporarily stores command Mem_cmd supplied from the memory controller 300, and supplies this command to the memory core controller 203. With signal Mem_DQS, the I/O buffer 204 strobes write data Dio and parity Pio, which are included in data Mem_DQ sent from the memory controller 300, and the resultant data and parity are supplied to the I/O controller 205. The I/O buffer 204 sends, as data Mem_DQ, read data Dio and parity data Pio supplied from the I/O controller 205, and send strobe signal Mem_DQS to the memory controller 300. Under the control of the memory core controller 203, the I/O buffer 204 supplies write data Dio and parity Pio to the I/O controller 205, and receives read data Dio and parity Pio from the I/O controller 205. Under the control of the memory core controller 203 and in accordance with the settings in the mode register 206, the I/O controller 205 supplies write data Dio and parity Pio to the memory cell array 207, and receives read data Dio and parity Pio from the memory cell array 207. As shown, for example, in FIG. 2, the mode register 206 retains the first setting information 206A and the second setting information 206B and includes a RDP1/WRP1 register and a RDP2/WRP2 register. The mode register 206 may further retain various kinds of information, in addition to the information described above. Based on the address and control signal supplied from the address buffer 201 and command buffer 202 and on the command truth table shown in FIG. 1, the memory core controller 203 writes data and a parity in the memory cell array 207 and reads data and a parity from the memory cell array 207. Based on the first command and the code in the first code register, the memory core controller 203 and the I/O controller 205 constitute a controller for accessing the data area and the t parity area. The code in the first code register is not necessarily required; it can be omitted, if so desired. Based on the second command and the code in the second code register, the memory core controller 203 and the I/O controller 205 constitute a controller for accessing the data area, the first parity area and the second parity area. The code in the second code register is not necessarily required; it can be omitted, if so desired. The memory core controller 203 and the I/O controller 205 constitute a controller for accessing the first parity area in response to the third command.

The memory cell array 207 includes a data area for storing data, a first parity area for storing parity 1 (the first parity) corresponding to the data, and a second parity area for storing parity 2 (the second parity) corresponding to the data and parity 1. Parity 1 is generated in the first error correction code (ECC) method in accordance with the data. Parity 2 is generated in the second error correction code (ECC) method in accordance with the data and parity 1. The first ECC method and the second ECC method have error correction capabilities of different levels. The first ECC method and the second ECC method are also referred to as "ECC1 method" and "ECC2 method", respectively. If at least one of the data and parity 1 is rewritten, the memory cell array 207 may further store a scrub flag indicating that parity 2 is invalid. The scrub flag may be omitted.

According to the present embodiment, the memory cell array 207 includes not only the data area and parity areas described above but also an area for storing a scrub flag (SFLAG). Parity 1 is used in the ECC1 method when a read/write operation is performed. Parity 2 is used in the ECC2 method when a scrub operation is performed. The scrub flag indicates whether parity 2 is valid or not. For example, the scrub flag is set as SFLAG=1 when parity 2 is valid and as SFLAG=0 when parity 2 is invalid. The values of the scrub flag may be inversed. The parity area may be provided independently of the memory cell array in which data is stored. Alternatively, the parity area may be provided for part or whole of the memory cell array 207.

The data area of the memory cell array 207 may include a plurality of banks BA (not shown). Each bank BA is configured to store data and is provided with elements including, at least, a plurality of memory cells 208 and various signal lines 209.

The detailed structure of bank BA differs, depending upon the type of RAM. For example, if the memory device 200 is an MRAM, the bank BA is configured to retain data in the memory cell 208 by utilization of the magnetoresistive effect. The memory cell of the MRAM includes a magnetic tunnel junction (MTJ) element and retains data in the nonvolatile manner in accordance with a state of magnetization.

If the memory device 200 is a DRAM, the bank BA is configured to retain data in the memory cell 208 by utilization of charge accumulation. The memory cell of the DRAM includes a capacitor and retains data in the nonvolatile manner in accordance with the charge of the capacitor.

If the memory device 200 is a ReRAM or PCRAM, the bank BA is configured to retain data in the memory cell 208 by utilization of a resistance change. The memory cell of the ReRAM includes a resistance change element made of a metallic oxide or a perovskite oxide. The state of resistance is changed by varying the pulse width (pulse application period), the amplitude (current value/voltage value) and the polarity (application direction) of a write pulse. The memory cell of the PCRAM includes a phase change element (resistance change element) made of chalcogenide or the like. The state of resistance is changed when a film in the phase change element is changed into a crystalline state or an amorphous state due to the heat caused by the write current.

The signal lines 209 include bit lines, word lines, etc. The banks BA may include a control circuit (not shown) for the respective banks.

<1-1-2> Configuration of Memory Controller

FIG. 6 is a schematic diagram illustrating how the memory controller is configured in the memory cell. The memory controller 300 comprises an address FIFO 301, a command buffer FIFO 302, a memory access controller 303, a write data FIFO 304, a read data FIFO 305, a timer 306 and an ECC control circuit 307. The address FIFO 301 temporarily stores address Sys_add supplied from the host device 400, and supplies this address to the memory access controller 303. The command buffer FIFO 302 temporarily stores command Sys_cmd supplied from the host device 400, and supplies this command to the memory access controller 303. The write data FIFO 304 temporarily stores write data Sys_DQIN supplied from the host device 400, and outputs write data WDin based on data Sys_DQIN. The read data FIFO 305 temporarily stores read data RDout and outputs read data Sys_DQOUT based on data RDout.

Based on command Sys_cmd, the memory access controller 303 generates address Mem_add and command Mem_cmd, which are used for writing data in address Sys_add and reading data from address Sys_add. In addition, the memory access controller 303 receives data Mem_DQ and Mem_DQS from the memory device 200, and outputs read data MRDin and parity RDin based on data Mem_DQ and Mem_DQS. Furthermore, the memory access controller 303 receives write data WDout and parity WPout, and generates therefrom data Mem_DQ and Mem_DQS which are to be written into the memory device 200. The memory access controller 303 configured as above functions as a command issuing circuit for issuing commands. For example, the memory access controller 303 functions as a first command issuing circuit which issues a single first command for the data area and the first parity area. For example, the memory access controller 303 functions as a second command issuing circuit which issues a single second command for the data area, first parity area and second parity area. For example, the memory access controller 303 functions as a third command issuing circuit which issues a single third command for the first parity area or the second parity area.

The timer 306 supplies signal. TIout (="H"-level pulse) to the ECC control circuit 307 at predetermined intervals.

The ECC control circuit 307 executes two ECC methods, as shown in FIG. 3, and comprises an ECC1 control circuit 307A and an ECC2 control circuit 307B. The ECC1 control circuit 307A and the ECC2 control circuit 307B correct errors in different ranges of the memory cell array 207. When data is read from the memory cell array 207, the ECC1 control circuit 307A performs error correction in the ECC1 method, using parity 1. When a scrub operation is performed for the memory cell array 207, the ECC2 control circuit 307B performs error correction in the ECC2 method, using parity 2. The ECC2 control circuit 307B performs a scrub operation, for example when it receives signal TIout from the timer 305 or a refresh command from the host device 400.

At the time of writing data, the ECC1 control circuit 307A receives write data WDin and outputs write data WDout based on write data WDin. In addition, the ECC1 control circuit 307A generates parity 1 (WPout) from write data WDin according to the error correction code generating rule of the ECC1 method. Parity 1 (WPout) is generated for each error correction unit (having a predetermined size) of write data WDin.

At the time of reading data or performing a scrub operation, the ECC1 control circuit 307A receives read data RDin and parity RDin and corrects an error in the read data RDin in the ECC1 method, using parity 1. The ECC1 control circuit 307A can correct an error of a predetermined value (e.g., 1 bit) in the input data having a size equal to that of the error correction unit. (e.g., part of read data RDin). At the time of reading data, the ECC1 control circuit 307A outputs read data RDout in which an error is corrected.

At the time of writing data, the ECC2 control circuit 307B receives read data RDin and parity 1 (RPin) and generates parity 2 from read data RDin and parity 1 according to the error correction code generating rule of the ECC2 method. Parity 2 is generated for each error correction unit (having a predetermined size) of write data WDin and parity 1. The ECC2 control circuit 307B outputs the generated parity 2 (WPout).

At the time of performing a scrub operation, the ECC2 control circuit 307B receives read data RDin and parities 1 and 2 (RPin). If there is a 1-bit error, the ECC1 control circuit 307A corrects it, and the ECC2 control circuit 3073 generates parity 2 from the corrected data and parity 1. If there is an error not less than 2 bits and not more than 32 bits, the ECC2 control circuit 307B corrects the error in the corresponding read data RDin and parity 1, using parity 2. Then, the ECC2 control circuit 307B generates parity 2 from the corrected data and parity 1. In either case, the ECC2 control circuit 307B outputs write data WDout (error-corrected data RDin) and parities 1 and 2 (WPout), based on the error correction result. The ECC2 control circuit 307B can correct an error in an predetermined range (e.g., not less than 2 bits and not more than 32 bits) in the input data having a size equal to the error correction unit (e.g., part of read data RDin).

[1-2] Operation

An operation of the memory system having the above configurations will now be described with reference to FIGS. 7 through 13. In the following, the read operation, write operation and scrub operation of the memory controller 300 will be described in the order mentioned. The "scrub" used herein is intended to refer to error correction performed at regular times and is applied as an error correction measure when high reliability is required.

[1-2-1] Read Operation

Figure 9:
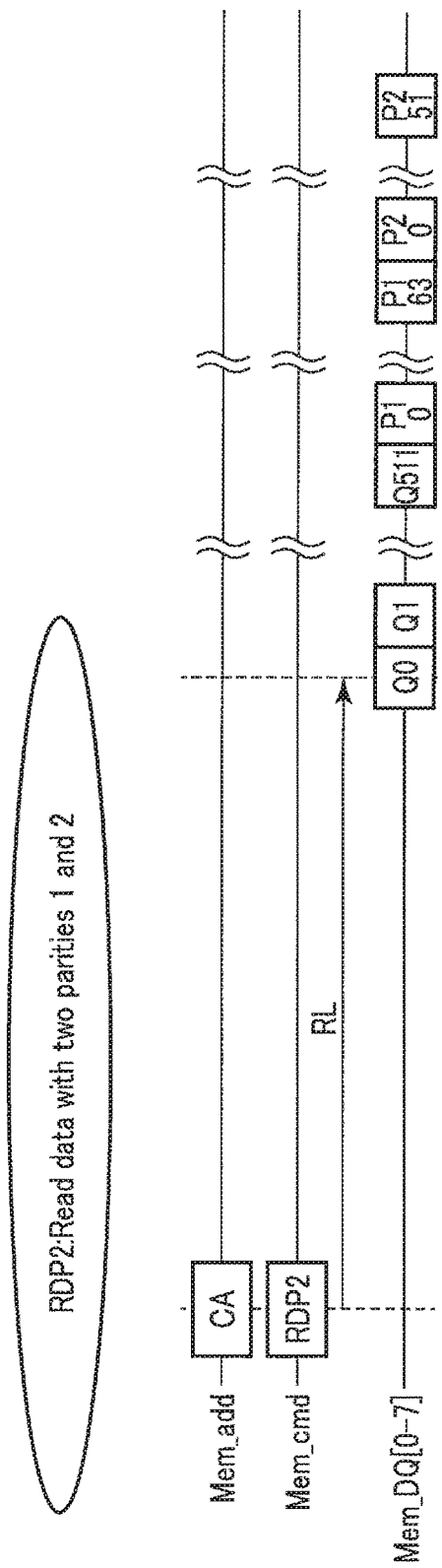
FIG. 9 is a timing chart illustrating bow a read operation is performed in response to an RDP2 command in the first embodiment.

First, the read operation will be described with reference to FIGS. 7 through 9.

Figure 7:
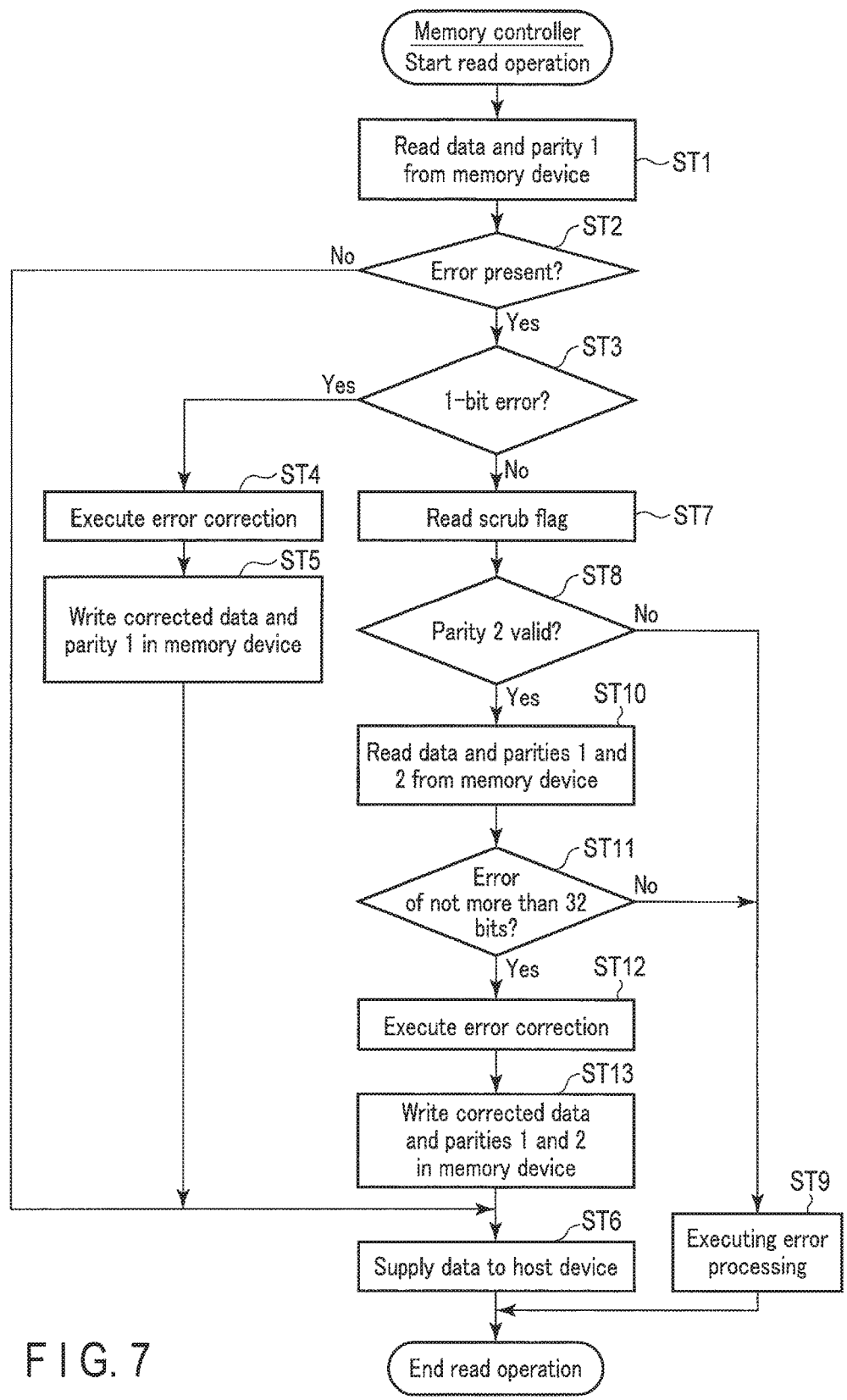
FIG. 7 is a flowchart illustrating how a read operation is performed in the first embodiment.

FIG. 7 is a flowchart illustrating the read operation performed by the memory controller 300. Broadly speaking, the read operation first tries to correct an error, using parity 1. If the error cannot be corrected (ST3), a scrub flag is read to confirm that parity 2 is valid (ST7 to ST8), and the correction of the error is tried again, using the powerful parity 2 (ST10 to ST11). The read operation of the memory controller 300 will be described in detail.

At the outset, the memory access controller 303 issues an RDP1 command, as shown in FIG. 8, and supplies the RDP1 command and a column address CA to the memory device 200. Upon receipt of the RDP1 command and the column address CA, the memory device 200 supplies read data RDin and parity 1 (RPin) corresponding to the column address CA to the memory controller 300 after a predetermined read latency RL. The memory access controller 303 reads read data RDin and parity 1 (RPin) from the memory device 200 (ST1). For example, when 8 B data and 1 B parity P1 are read, code "000", corresponding to the 8 B data and 1 B parity 1 in the first setting information 206A, is set in the RDP1/WRP1 register of the mode register 206. The I/O controller 205 stores a positional relation between the data and parities 1 and 2, as shown in FIG. 4. Based on this relation and the CA indicating the storage position of the data, PA is specified, which indicates the storage position of parity 1 corresponding to the data. For example, PA is specified based on the relation PA=CA+512 B, which indicates that parity 1 is stored in the column address upper than the storage position of the data by 512 B. As a result, the 8 B data indicated by the CA and the 1 B parity 1 indicated by the PA can be read.

The memory access controller 303 may receive an RD command and a column address CA instead of the RDP1 command. In this case, the memory access controller 303 outputs 8 B data after a predetermined read latency RL, then receives an RDP command and parity address PA, and reads 1 B parity 1 after a predetermined read latency. Alternatively, the memory access controller 303 may successively receive an RD command, a column address CA, an RDP command and a parity address PA, instead of the RDP1 command. In this case, the memory access controller 303 successively outputs 8 B data and 1 B parity 1 after a predetermined read latency RL. Instead of performing step ST1, the memory access controller 303 may receive an RDP2 command and a column address CA, as shown in FIG. 9. In this case, the memory access controller 303 reads 512 B data, 64 B parity 1 and 52 B parity 2. Likewise, where the second setting information 206B shown in FIG. 2 is used, code "100", corresponding to the 512 B data and 64 B parity 1 and 52 B parity 2, is set in the RDP2/WRP2 register of the mode register 206. In this case, the I/O controller 205 stores a positional relation between the data and parities 1 and 2, as shown in FIG. 4. Based on this relation and the CA indicating the storage position of the data, PA1 and PA2 are specified, which indicate the storage positions of parities 1 and 2 corresponding to the data. For example, PA1 and PA2 are specified based on the relations PA1=CA+512 B and PA2=PA1+64 B, which indicate that parity 1 is stored in the column address upper than the storage position of the data by 512 B and that parity 2 is stored in the column address upper than the storage position of parity 1 by 64 B. As a result, the 512 B data indicated by the CA, 64 B parity 1 indicated by PA1 and the 52 B parity 2 indicated by PA2 can be read.

After step ST1 shown in FIG. 7, the ECC1 control circuit 307A executes the error correction, using parity 1 (ST2 to ST4). First, the ECC1 control circuit 307A determines whether or not there is an error in read data RDin (ST2). If there is no error, the processing flow advances to step ST6. In step ST6, the ECC control circuit 307 reads read data RDout and supplies it to the host device 400 through the data FIFO 305. As a result, the read operation comes to an end.

If the determination in step ST2 shows that there is an error, the ECC1 control circuit 307A corrects the error (ST3 and ST4) if it can be corrected in the ECC1 method. To be specific, the ECC1 control circuit 307A determines whether the error is a 1-bit error or not (ST3), and corrects the error if it is a 1-bit error (ST4). Thereafter, the memory access controller 303 stores the corrected data and parity 1 in the memory device 200 in response to the WRP1 command (ST5). The corrected data may be stored at a later time. After step ST5, the processing flow advances to step ST6, in which the corrected data is supplied to the host device 400. In this manner, the read operation comes to an end.

If the determination in step ST3 shows that the error is not a 1-bit error, the memory access controller 303 reads a scrub flag from the memory device 200 (ST7).

The ECC2 control circuit 307B refers to the scrub flag and determines whether or not parity 2 is valid (ST8). If parity 2 is not valid, the processing flow advances to step ST9. In step ST9, error processing is executed. In the error processing, "non-response", "a response with a predetermined error pattern" or the like may be used. This holds true of the error processing performed in other operations, such as the operation performed in step ST38. After the error processing, the read operation comes to an end.

If the determination in step ST8 shows that parity 2 is valid, the memory access controller 303 reads data and parities 1 and 2 from the memory device 200 in response to the RDP1 command (ST10). For example, the memory access controller 303 reads 512 B data, 64 B parity 1 and 52 B parity 2.

The ECC2 control circuit 307B corrects the error (ST11 and ST12) if the error can be corrected in the ECC2 method. To be specific, the ECC2 control circuit 307B determines whether the error is an error of not more than 32 bits (ST11), and corrects the error if it is so (ST12). Thereafter, the memory access controller 303 stores the corrected data and parities 1 and 2 in the memory device 200 in response to the WRP2 command (ST13). The corrected data may be stored at a later time. After step ST13, the processing flow advances to step ST6, in which the corrected data is supplied to the host device 400. In this manner, the read operation comes to an end. If the determination in step ST11 shows that the error is an error of more than 32 bits, the processing flow advances to step in which error processing is executed. After the error processing, the read operation comes to an end.

[1-2-2] Write Operation

Next, the write operation will be described with reference to FIGS. 10 through 12.

Figure 10:
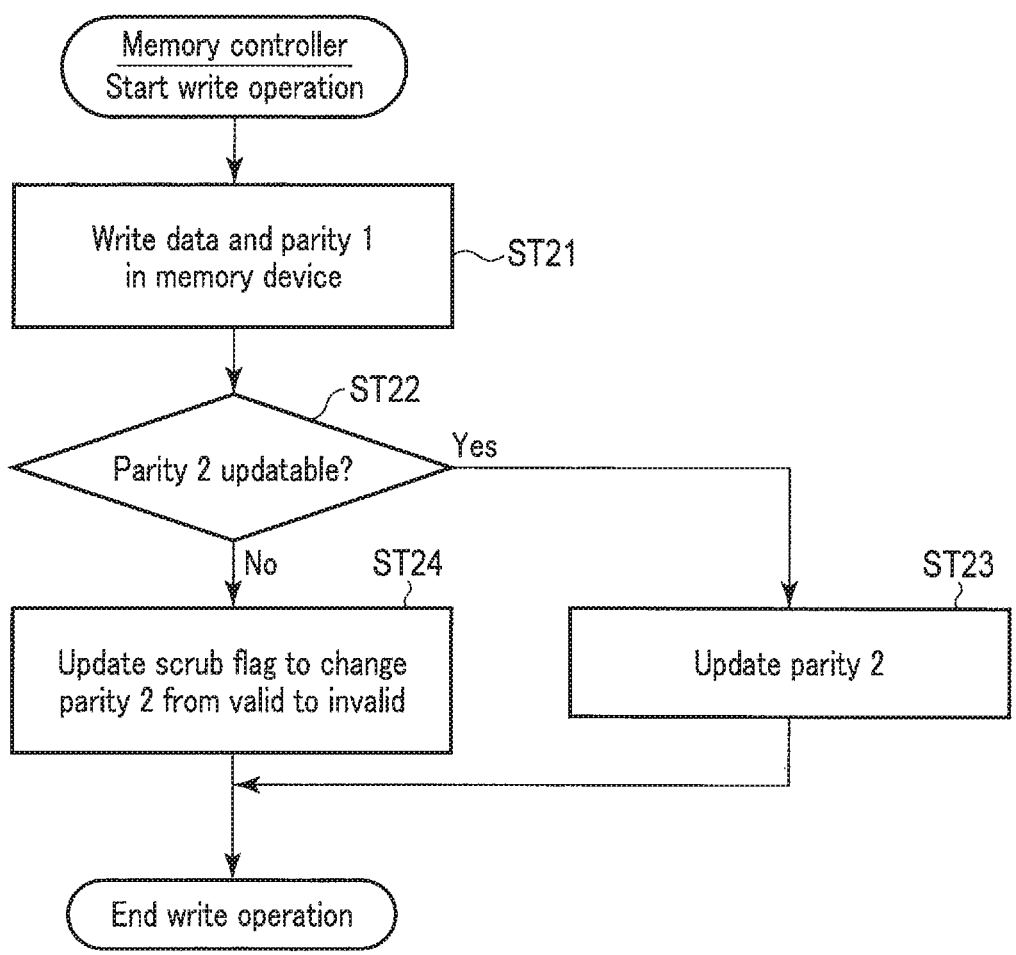
FIG. 10 is a flowchart illustrating how a write operation is performed in the first embodiment.

FIG. 10 is a flowchart illustrating the write operation performed by the memory controller. The write operation of the memory controller 300 will be described.

At the outset, the memory access controller 303 issues a WRP1 command, as shown in FIG. 11, and supplies the WRP1 command and a column address CA to the memory device 200. After a predetermined write latency WL, the memory access controller 303 supplies write data and parity 1 to the memory device 200. The write latency WL may be shorter than the read latency RL; alternatively, it may be longer than the read latency RL. The latencies RL and WL can be determined in accordance with the processing times of the memory controller 300 and the storage device 200. For example, if the memory device 200 is modified to correct an error, the processing time of the memory device 200 increases in accordance with an increase in the number of error correction bits. In such a case, the read latency RL may be determined to be longer than the write latency WL. In the scrub operation, the read operation and the write operation are repeatedly performed. In this case, the read latency RL and the write latency WL may be set as being equal to each other. In either case, the memory access controller 303 writes write data and parity 1 in the memory device 200 (ST21). For example, when 8 B data and 1 B parity P1 are written, code "000", corresponding to the 8 B data and 1 B parity 1 in the second setting information 206B, is set in the RDP1/WRP1 register of the mode register 206.

The memory access controller 303 may receive a WR command and a column address CA instead of the WRP1 command. In this case, the memory access controller 303 writes 8 B data after a predetermined write latency WL, then receives a WRP command and parity address PA, and writes 1 B parity 1 after a predetermined read latency. Alternatively, the memory access controller 303 may successively receive a WR command, a column address CA, a WRP command and a parity address PA, instead of the WRP1 command. In this case, the memory access controller 303 writes 8 B data and 1 B parity 1 after a predetermined write latency WL.

After step ST21 shown in FIG. 10, the ECC2 control circuit 307B determines whether or not parity 2 can be updated (ST22). If the update is possible, parity 2 updated (ST23), and the write operation comes to an end. The case where parity 2 can updated is, for example, a case where the data required for updating parity 2 is stored in a cache. In step ST23, the memory controller 300 may update parity 2 only; alternatively, it may update data and parities 1 and 2. In the latter case, 512 B data, 64 B parity 1 and 52 B parity 2 may be written in response to a WRP2 command, as shown in FIG. 12. Likewise, where the second setting information 206B shown in FIG. 2 is used, code "100", corresponding to the 512 B data, 64 B parity 1 and 52 B parity 2, is set in the RDP2/WRP2 register of the mode register 206.

If the determination in step ST22 shows that parity 2 cannot be updated, the scrub flag is updated in such a manner as to indicate the invalidity of parity 2 (ST24), and the write operation comes to an end.

[1-2-3] Scrub Operation

Figure 13:
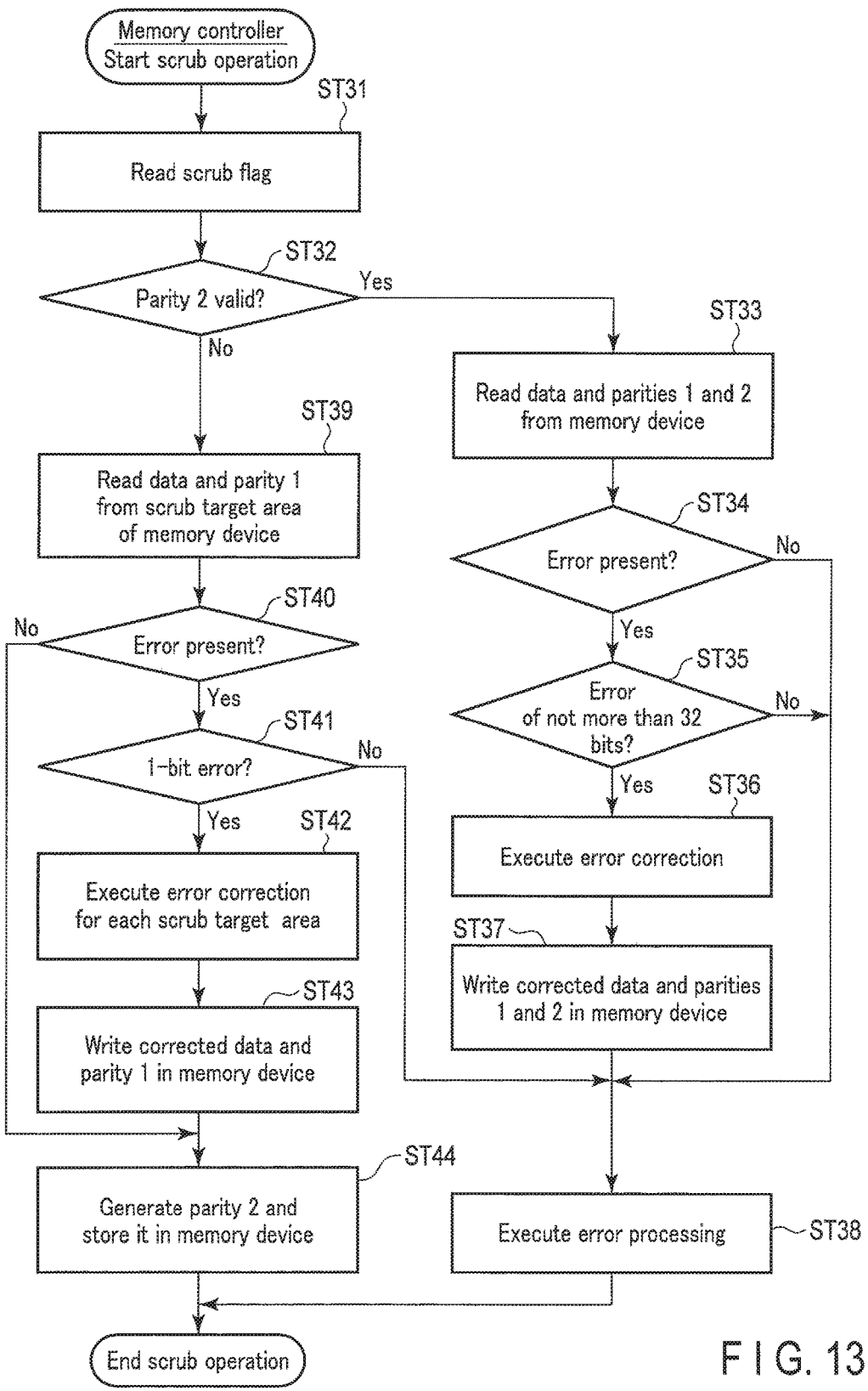
FIG. 13 is a flowchart illustrating how a scrub operation is performed in the first embodiment.

Next, a scrub operation will be described with reference to the flowchart of FIG. 13. The scrub operation is intended to refer to error correction performed at regular times and is applied as a software error correction measure when high reliability is required. The trigger for the start of the scrub operation may be a signal which the ECC control circuit 307 receives from the timer 306 or a refresh command which the ECC control circuit 307 and the memory access controller 303 receive from the host device 400. The scrub operation of the memory controller 300 will be described below. In the description below, reference will be made to the case where a scrub operation is executed in units of 512 B.

Upon receipt of a refresh command from the host device 400, the memory access controller 303 reads the scrub flag from the memory device 200 (ST31).

The ECC2 control circuit 307B refers to the scrub flat and determines whether or not parity 2 is valid (ST32). If parity is not valid, the processing flow advances to step ST9, in which parity 1 etc. is read.

If the determination in step ST32 shows that parity 2 is valid, the memory access controller 303 enters an RDP2 command and a column address CA and reads data and parities 1 and 2 from the memory device 200 after a predetermined read latency RL (ST33). For example, the memory access controller 303 reads 512 B data, 64 B parity 1 and 52 B parity 2. Alternatively, the memory access controller 303 may successively enter an RD command, a column address CA, an RDP command and a parity address PA, instead of the RDP2 command. In this case, the memory access controller 303 successively reads data and parities 1 and 2 after a predetermined read latency RL.

The ECC2 control circuit 307B corrects the error (ST34 to T36) if the error can be corrected in the ECC2 method. To be specific, the ECC2 control circuit 307B determines, based on parity 2, whether or not there is an error in data and parity 1 (ST34). If there is no error, the processing flow advances to step ST38.

If there is an error, the ECC2 control circuit 307B determines whether the error is an error of not more than 32 bits (ST35). If the determination in step ST35 shows that the error is not an error of not more than 32 bits, the processing flow advances to step ST38, in which error processing is executed. If the determination shows that the error is an error of not more than 32 bits, the error in the data and parity 1 is corrected (ST36). Subsequently, the memory access controller 303 enters a WRP2 command and a column address CA and stores the data, parity 1 and parity 2, which are corrected in step ST36, in the memory device 200 after a predetermined write latency RL (ST37). Where the write and read latencies WL and RL are set as being equal to each other, the command input and data transmission of the WRP2 command and the command input and data transmission of the RDP2 command are set as being executed at the same timings. To be more specific, if the timing chart of the WRP2 command and the timing chart of the RDP2 command are shown, with their left ends aligned, the command input and data transmission of the WRP2 command and those of the RDP2 command are aligned and therefore executed at the same timings. The corrected data and parity 1 may be stored (step ST37) at a later time.

The memory access controller 303 may successively receive a WR command, a column address CA, a WRP command and a parity address PA, instead of the WRP2 command. In this case, the memory access controller 303 writes data and parities 1 and 2 after a predetermined write latency WL. Where the write and read latencies WL and RL are set as being equal to each other, the command input and data transmission of the WR command and the command input and data transmission of the WRP command are set as being executed at the same timings, and the command input and data transmission of the RD command and the command input and data transmission of the RDP command are executed at the same timings. To be more specific, if the timing chart of the WR command, the timing chart of the WRP command, the timing chart of the RD command and the timing chart of the RDP command are shown, with their left ends aligned, the command inputs and data transmissions of the respective timing charts are aligned and therefore executed at the same timings.

If the determination in step ST32 shows that parity 2 is invalid, the memory access controller 303 reads data and parity 1 from the scrub target area of the memory device 200 in response to the RDP1 command (Step ST39). For example, the memory access controller 303 reads 512 B data and 64 B parity 1.

Using parity 1, the ECC1 control circuit determines whether or not there is an error in read data (ST40). If there is no error, the processing flow advances to step ST44.

In step ST44, the ECC1 control circuit 307A generates parity 2 from the read data and parity 1, and the memory access controller 303 stores parity 2 in the memory device 200 in response to the WRP command (ST44). In this manner, the scrub operation comes to an end.

If the determination in step ST40 shows that there is an error, the ECC1 control circuit 307A corrects the error (ST41 to ST43) if it can be corrected in the ECC1 method. To be specific, the ECC1 control circuit 307A determines whether the error is a 1-bit error or not (ST41), and corrects the error if it is a 1-bit error (ST42). Thereafter, the memory access controller 303 stores the corrected data and parity 1 in the memory device 200 in response to the WRP1 command (ST43). The corrected data may be stored at a later time.

After step ST43, the processing flow advances to step ST44. The ECC1 control circuit 307A generates parity 2 from the corrected data and parity 1, and the memory access controller 303 stores parity 2 in the memory device 200 in response to the WRP command (ST44). In this manner, the scrub operation comes to an end.

[1-3] Advantages of Present Embodiment

According to the present embodiment, both a data area and a parity area of at least one parity can be accessed in response to a single command. Accordingly, the number of times a command is issued can be reduced, and the usage rate of the command bus can be decreased. According to the present embodiment, the data area may be accessed by properly using a single command (RD or WR command) in addition to the above-mentioned commands (namely, RDP1, RDP2, WRP1 and WRP2 commands), and the parity area may be accessed by using a single command (RDP or WRP command). The present embodiment prevents the performance degradation due to the limited command band width.

The present embodiment will be compared with a comparative example in terms of the number of commands that are issued. It is assumed here that the setting is BL=8 in the case where 512 B data, 64 B parity 1 and 52 B parity 2 are accessed, and that 8 B data or a parity can be accessed in response to a single command.

In the above case, the comparative example requires as many as 79 commands, whereas the present embodiment requires only one command.

[1-4] Modifications of First Embodiment

[1-4-0] Outline of First to Third Modifications

A description will be given of the first to third modifications of the memory system of the first embodiment. According to the first to third modifications, the memory cell array 207 is configured in such a manner that data and parity 1 are stored in pages which are of the same bank and have the same row address. Parity 2 is distributedly stored in a plurality of banks of the memory cell array 207, or in a plurality of chips thereof. To be specific, the memory cell array 207 includes a plurality of data areas, a plurality of first parity areas, and a plurality of second parity areas. The data areas are arranged in a plurality of banks or in a plurality of chips, and individually store a plurality of data portions constituting access-unit data. The first parity areas are adjacent to the data areas and individually store a plurality of first parity portions constituting the first parity corresponding to the data. The second parity areas are distributed among a plurality of banks or a plurality of chips and individually store a plurality of second parity portions constituting the second parity corresponding to the data and first parity. The first to third modifications are different in terms of the specific arrangement of the data, parity 1 and parity 2. The modifications will be described.

[1-4-1] First Modification

Figure 14:
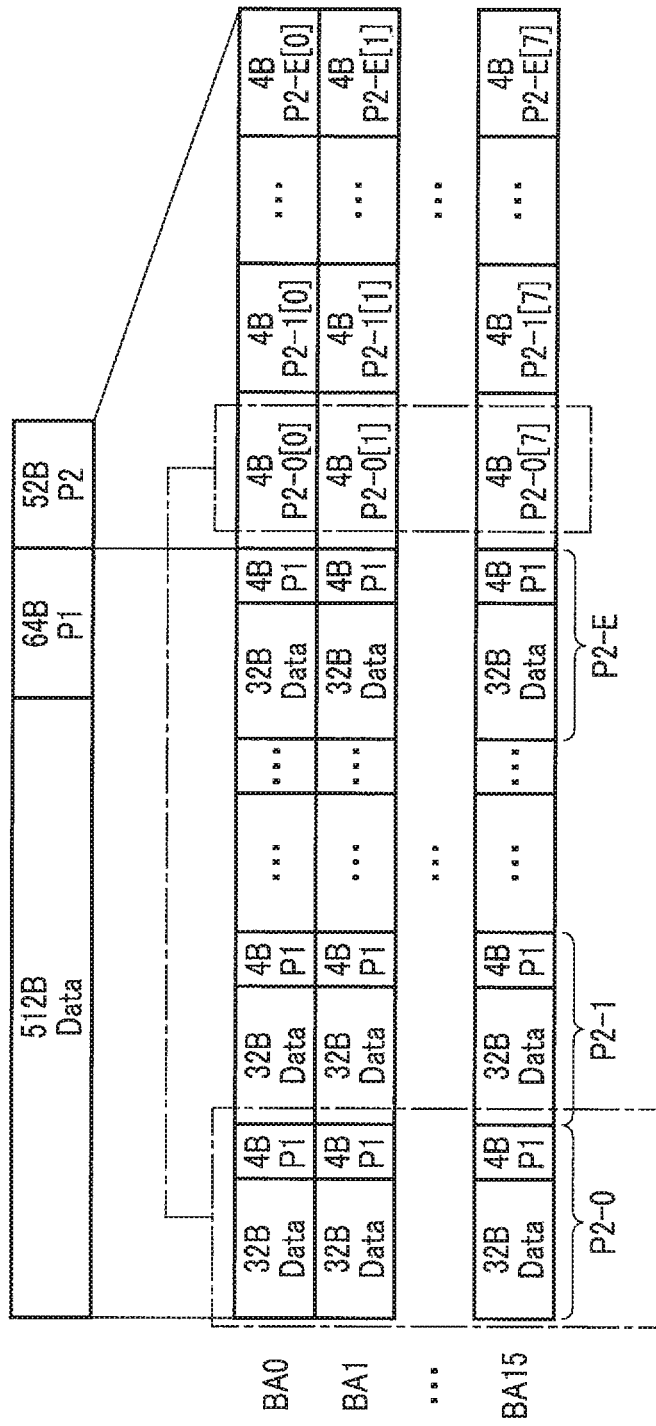
FIG. 14 is a schematic diagram illustrating a data structure according to the first modification of the first embodiment.

First, the first modification of the memory system of the first embodiment will be described, as shown in FIG. 14. The first modification differs from the first embodiment in terms of the data structure wherein parity 2 is assigned to different banks BF0 to BA15 of the memory cell array 207.

In the first modification, 64 B parity 1 and 64 B parity 2 are assigned to 512 B data, as shown in the uppermost portion of FIG. 14. As shown in the other portions of FIG. 14, the actual storage positions are not reflected in the relation depicted in the uppermost portion. That is, according to the first modification, the 512 B data and 64 B parity 1 are arranged in lower column addresses of the pages of different banks BA0 to BA15, while 64 B parity 2 is arranged in upper column addresses of the pages of the banks BA0 to BA15. In this arrangement, the storage positions of data and the storage positions of parities 1 and 2 can be specified based on the bank groups (BA0 to BA15 groups) designated by BG&BA signals and the lower CA designated by the "A11,A0-9" signals. In this case, the I/O controller 205 stores a positional relation between the data and parities 1 and 2, as shown in FIG. 14. Based on this relation and the CA, PA1 and PA2 indicating the storage positions of parities 1 and 2 are specified. For example, in data-parity set P2-0, PA1 and PA2 are specified based on the relations PA1=CA+32 B and PA2=CA+512 B+64 B, which indicate that parity 1 is stored in the column address upper than the storage position of the data by 32 B and that parity 2 is stored in the column address upper than the storage position of the data by 512 B+64 B. As a result, the 512 B data indicated by the CA, the 64 B parity indicated by PA1 and the 64 B parity 2 indicated by PA2 can be read. Likewise, with respect to the other data-parity sets P2-1 to P2-E, the I/O controller 205 can specify PA1 and PA2 from the CA, based on the relation shown in FIG. 14 and CA.

In the ECC1 method, 1 B parity 1 corresponds to 8 B data. That is, in the ECC1 method, 64 sets of data and parities are used for the 512 B data. 512 B Data+64 B Parity 1=64 Sets×(8 B Data+1 B Parity)

In the ECC2 method, 64 B parity 2 corresponds to 64 B data. In the ECC2 method, 32 B data (e.g., the data indicated as "P2-0" in FIG. 14) and 4 B parity 2 are assigned to the 16 banks BA0 to BA15 from each page. Each page includes 16 (data-parity) sets P2-0 to P2-E. As can be seen from this, in the ECC2 method, the data and parities are structured as follows:
Data: 512 B Data+64 B Parity 1
=(32 B data+4 B parity 1)×16 banks
Parity: 64 B Parity 2
=4 B parity 2×16 banks The first modification described above produces the advantages of the first embodiment. In addition, the first modification is featured in that data and parities 1 and 2 are distributedly stored in a plurality of banks BA0 to BA15. By virtue of this feature, the data damage due to a memory defect caused by long-term use can be distributed.

According to the first modification, a plurality of banks may be replaced with a plurality of chips. In other words, the first modification permits parity 2 to be distributed or assigned to a plurality of chips. FIG. 15 is a schematic diagram illustrating the case where the banks BA0 to BA15 of the first modification are replaced with memory chips 200-0 to 200-15. The memory chips 200-0 to 200-15 are semiconductor chips each having a similar feature to that of the storage device 200 of the first embodiment, and are used in place of the banks BA0 to BA15. Memory chips 200-0 to 200-3 are provided, for example, in a DIMM (dual inline memory module) 200-D0. Memory chips 200-4 to 200-7 are provided in DIMM 200-D1. Memory chips 200-8 to 200-11 are provided in DIMM 200-D2. Memory chips 200-12 to 200-15 are provided in DIMM 200-D3. The memory chips 200-0 to 200-15 are controlled by the memory controller 300, and data and parities 1 and 2 are assigned to them, in the same way as they are assigned to the banks BA0 to BA15 shown in FIG. 14.

Therefore, even when the banks BA0 to BA15 of the first modification are replaced with memory chips 200-0 to 200-15, the advantages of the first modification are obtained. The data structure shown in FIGS. 14 and 15 is not limited to the first modification but may be applicable to modifications and embodiments described below.

[1-4-2] Second Modification

The second modification of the memory system of the first embodiment will be described with reference to FIG. 16. The second modification differs from the first embodiment described above in terms of the data structure wherein parity 2 is assigned to different banks BA0 to BA7 or BA8 to BA15 of the memory cell array 207. In the second modification, a plurality of banks (e.g., BA0 to BA7) to which data and parity 1 are assigned differ from a plurality of banks (e.g., BA8 to BA15) to which parity 2 corresponding to the data and parity 1 is assigned. Banks BA0 to BA7 will be referred to as a first bank group, and banks BA8 to BA15 will be referred to as a second bank group. According to the second modification, the bank group to which the data and parity 1 are assigned is different from the bank group to which parity 2 is assigned. According to the second modification, a plurality of banks may be replaced with a plurality of chips. In other words, the second modification permits parity 2 to be distributed or assigned to a plurality of chips.

In the second modification, 64 B parity 1 and 56 B parity 2 are assigned to 512 B data, as shown in the uppermost portion of FIG. 16. As shown in the other portions of FIG. 16, the actual storage positions are not reflected in the relation depicted in the uppermost portion. That is, according to the second modification, the 512 B data and 64 B parity 2 are arranged in lower column addresses of the pages of different banks BA0 to BA15, while 64 B parity 2 is arranged in upper column addresses of the pages of the banks BA0 to BA15. In this arrangement, the storage positions of data and the storage positions of parities 1 and 2 can be specified based on the first bank groups (BA0 to BA7 groups) designated by BG&BA signals, the second bank groups (BA8 to BA15) and the lower CA designated by the "A11,A0-9" signals. In this case, the I/O controller 205 stores a positional relation between the data and parities 1 and 2, as shown in FIG. 16. Based on this relation and the CA, PA1 and PA2 indicating the storage positions of parities 1 and 2 are specified. For example, in data-parity set P2-0A, PA1 and PA2 are specified based on the relations PA1=CA+64 B and PA2=CA+512 B+64 B, which indicate that parity 1 is stored in the column address upper than the storage position of the data by 64 B and that parity 2 is stored in the column address upper than the storage position of the data by 512 B+64 B. As a result, the 512 B data indicated by the CA, the 64 B parity 1 indicated by PA1 and the 56 B parity 2 indicated by PA2 can be read. Likewise, with respect to the other data-parity sets P2-1A to P2-7A and P2-0B to P2-7B, the I/O controller 205 can specify PA1 and PA2 from the CA, based on the relation shown in FIG. 16 and CA. Of data-parity sets P2-0A to P2-7A and P2-0B to P2-7B, those sets that are identified by symbols different only at their last letters (e.g., P2-0A and P2-0B) may be stored in different banks but the same CA, PA1 and PA2 are used for them.

In the ECC1 method, 1 B parity 1 corresponds to 8 B data. That is, in the ECC1 method, 64 sets of data and parities are used for the 512 B data. 512 B Data+64 B Parity 1=64 Sets×(8 B Data+1 B Parity)

In the ECC2 method, 56 B parity 2 corresponds to (512 B+64 B) data. According to the ECC2 method, 64 B data and 7 B parity 2 are assigned to the 8 banks BA0 to BA15 or BA8 to BA15 from each page. As can be seen from this, in the ECC2 method, the data and parities are structured as follows:
Data: 512 B Data+64 B Parity 1=(64 B data+8 B parity 1)×8 banks
Parity: 56 B Parity 2 7 B parity 2×8 banks Parities 2 corresponding to the 512 B data (P2-0A) of banks BA0 to BA7 are stored in banks BA8 to BA15, and parities 2 corresponding to the 512 B data (P2-0B) of banks BA8 to BA15 are stored in banks BA0 to BA7. Eight parities 2 {P2-0A, P2-1A, . . . , P2-7A} or {P2-0B, P2-1B, . . . , P2-7B} are assigned to each page.

The second modification described above produces the advantages of the first embodiment. In addition, the second modification is featured in that data and parity 1 and parity 2 are distributedly stored in a plurality of banks {BA0 to BA7} and {BA8 to BA15}. By virtue of this feature, the data damage due to a memory defect caused by long-term use can be distributed.

Figure 17:
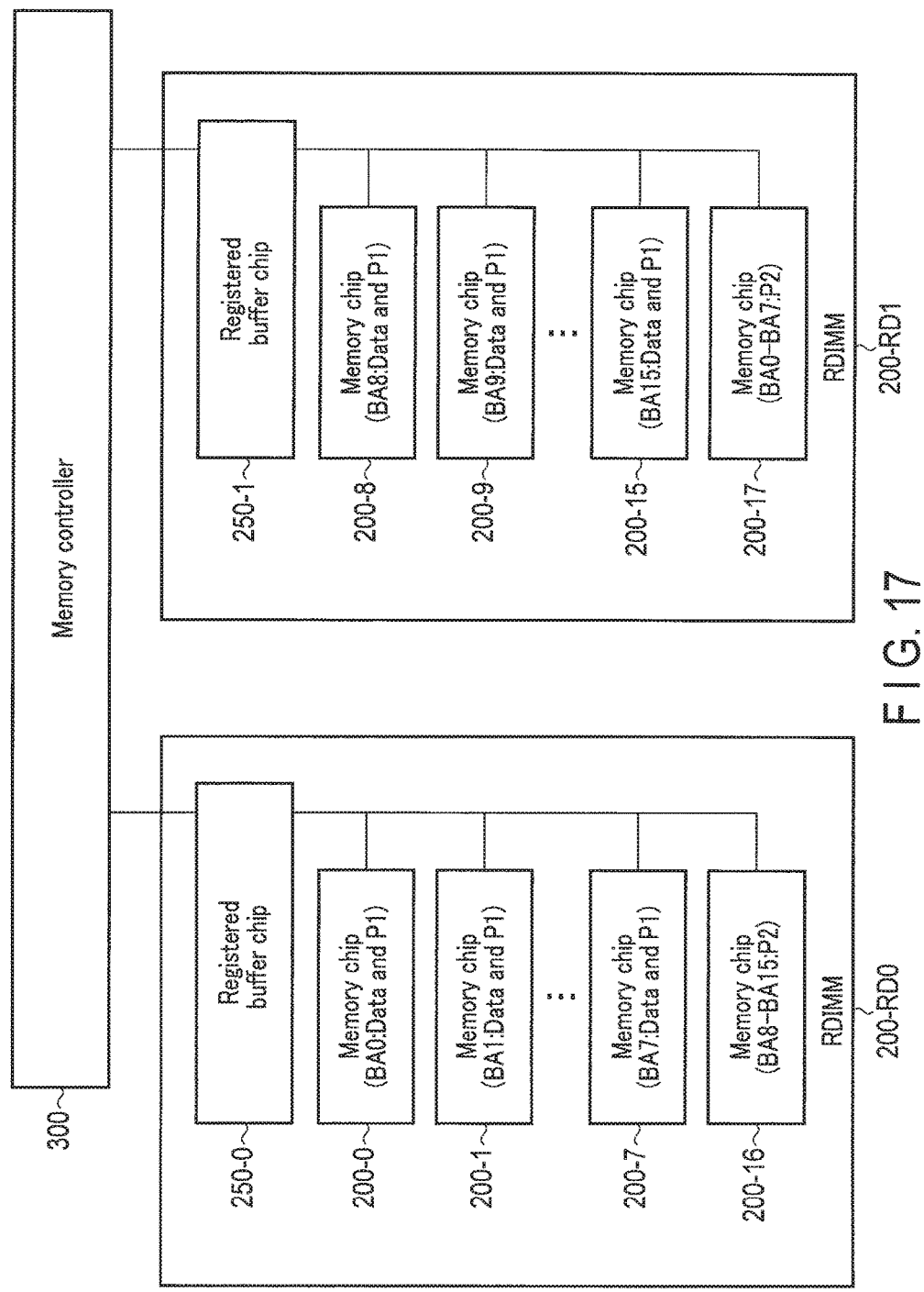
FIG. 17 is a schematic diagram illustrating a data structure obtained by further modifying the data structure of the second modification.

According to the second modification, a plurality of banks may be replaced with a plurality of chips. In other words, the second modification permits parity 2 to be distributed or assigned to a plurality of chips. FIG. 17 is a schematic diagram illustrating the case where the banks BA0 to BA15 of the second modification are replaced with memory chips 200-0 to 200-18. The memory chips 200-0 to 200-18 are semiconductor chips each having a similar feature to that of the storage device 200 of the first embodiment, and are used in place of the banks BA0 to BA15. Memory chips 200-0 to 200-7 and 200-16 are connected to the memory controller 300 through a registered buffer chip 250-0. The registered buffer chip 250-0 temporarily stores address signals and control signals received from the memory controller 300. After being shaped and amplified, the address signals and the command signals are supplied to the memory chips 200-0 to 200-7 and 200-16. The memory chips 200-0 to 200-7 and 200-16 and the registered buffer chip 250-0 are provided in RDIMM (registered DIMM) 200-RD0. Likewise, memory chips 200-8 to 200-15 and 200-17 are connected to the memory controller 300 through a registered buffer chip 250-1. The registered buffer chip 250-1 temporarily stores address signals and control signals received from the memory controller 300. After being shaped and amplified, the address signals and the command signals are supplied to the memory chips 200-8 to 200-15 and 200-17. The memory chips 200-8 to 200-15 and 200-17 and the registered buffer chip 250-1 are provided in RDIMM 200-RD1. The memory chips 200-0 to 200-17 are controlled by the memory controller 300, and data and parities 1 and 2 are assigned to them, in the same way as they are assigned to the banks BA0 to BA15 shown in FIG. 16. Data and parity 1 are assigned to the memory chips 200-0 to 200-15 in the same way as they are assigned to the banks BA0 to BA15. Parity 2 is assigned to the memory chip 200-16 in the same way as it is assigned to the banks BA8 to BA15. Parity 2 is assigned to the memory chip 200-17 in the same way as it is assigned to the banks BA0 to BA7.

Therefore, even when the banks BA0 to BA15 of the second modification are replaced with memory chips 200-0 to 200-17, the advantages of the second modification are obtained. The data structure shown in FIGS. 16 and 17 is not limited to the second modification but may be applicable to other modifications and embodiments.

[1-4-3] Third Modification

The third modification of the memory system of the first embodiment will be described with reference to FIG. 18. The third modification differs from the first embodiment described above in terms of the data structure wherein parity 2 is assigned to different input/output terminals {I/O0, I/O2, I/O4, I/O6} or {I/O1, I/O3, I/O5, I/O7} of the memory cell array 207. The input/output terminals {I/O0, I/O2, I/O4, I/O6}, which are identified by even numbers, will be referred to as a first group, and the input/output terminals {I/O1, I/O3, I/O5, I/O7}, which are identified by odd numbers, will be referred to as a second group. According to the third modification, the bank group to which the data and parity 1 are assigned is different from the bank group to which parity 2 is assigned.

Banks BA0 to BA15 of the first group (i.e., input/output terminals identified by even numbers) will be referred to as a third bank group, and banks BA0 to BA15 of the second group (i.e., input/output terminals identified by odd numbers) will be referred to as a fourth bank group According to the third modification, the bank group to which the data and parity 1 are assigned is different from the bank group to which parity 3 is assigned.

According to the third modification, a plurality of banks may be replaced with a plurality of chips. In other words, the third modification permits parity 2 to be distributed or assigned to a plurality of chips. The data structure shown in FIG. 18 is not limited to the third modification but may be applicable to other modifications and embodiments.

Figure 18:
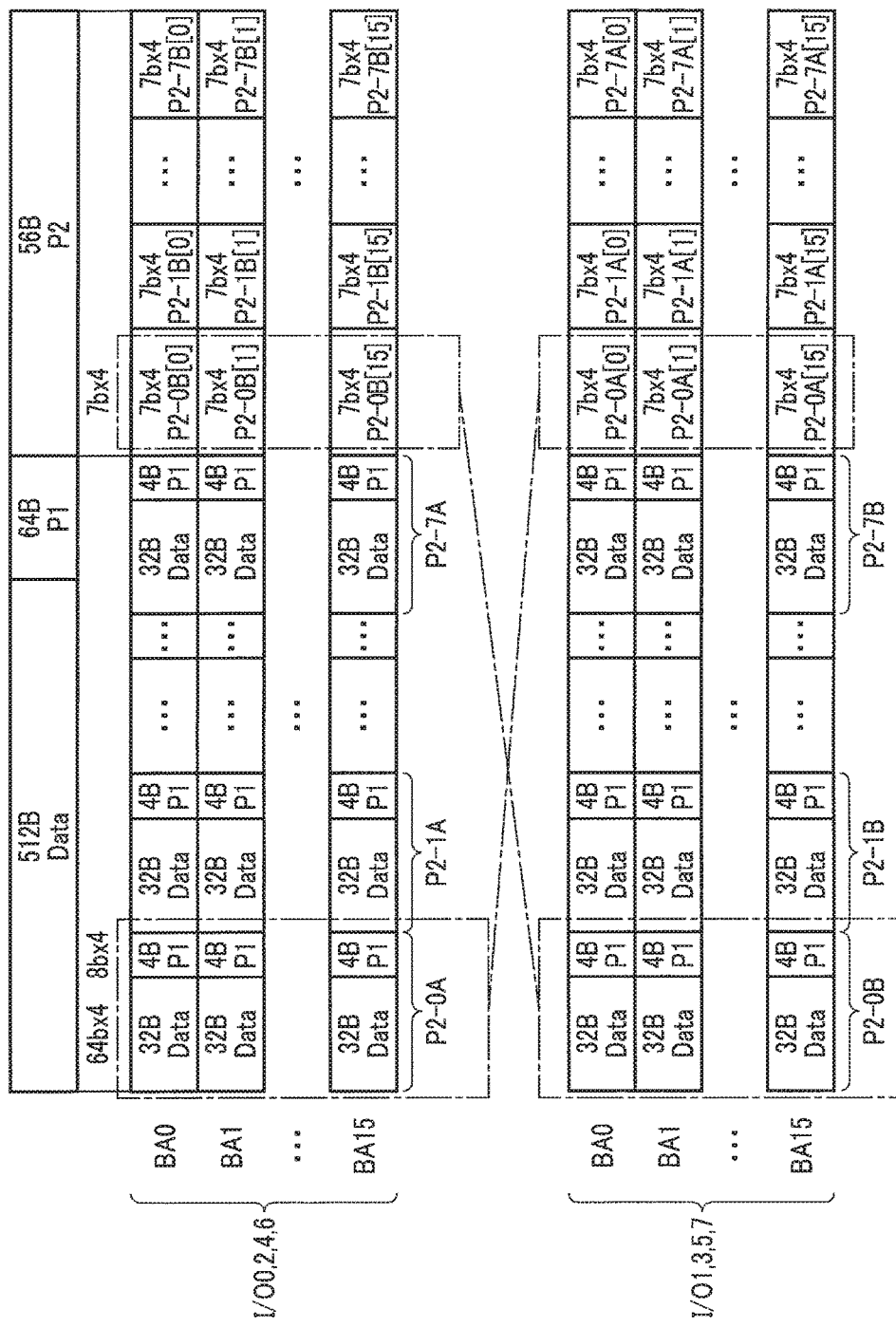
FIG. 18 is a schematic diagram illustrating a data structure according to the third modification of the first embodiment.

In the third modification, 64 B parity 1 and 56 B parity 2 are assigned to 512 B data, as shown in the uppermost portion of FIG. 18. As shown in the other portions of FIG. 18, the actual storage positions are not reflected in the relation depicted in the uppermost portion. That is, according to the third modification, the 512 B data and 64 B parity 2 are arranged in lower column addresses of the pages of different banks BA0 to BA15 corresponding to the even-numbered and odd-numbered input/output terminals, while 64 B parity 2 is arranged in upper column addresses of the pages of the banks BA0 to BA15. In this arrangement, the storage positions of data and the storage positions of parities 1 and 2 can be specified based on the third and fourth bank groups designated by BG&BA signals and the lower CA designated by the "A11,A0-9" signals. In this case, the I/O controller 205 stores a positional relation between the data and parities 1 and 2, as shown in FIG. 18. Based on this relation and the CA, PA1 and PA2 indicating the storage positions of parities 1 and 2 are specified. For example, in data-parity set P2-0A, PA1 and PA2 are specified based on the relations PA1=CA+32 B and PA2=CA+12 B+64 B, which indicate that parity 1 is stored in the column address upper than the storage position of the data by 32 B and that parity 2 is stored in the column address upper than the storage position of the data by 512 B+64 B. As result, the 512 B data indicated by the CA, the 64 B parity 1 indicated by PA1 and the 56 B parity 2 indicated by PA2 can be read. Likewise, with respect to the other data-parity sets P2-1A to P2-7A and P2-0B to P2-7B, the I/O controller 205 can specify PA1 and PA2 from the CA, based on the relation shown in FIG. 18 and CA. Of data-parity sets P2-0A to P2-7A and P2-0B to P2-7B, those sets that are identified by symbols different only at their last letters (e.g., P2-0A and P2-0B) may be stored in different bank groups related to input/output terminals but the same CA, PA1 and PA2 are used for them.

In the ECC1 method, 1 B parity 1 corresponds to 8 B data. That is, in the ECC1 method, 64 sets of data and parities are used for the 512 B data. 512 B Data+64 B Parity 1=64 Sets×(8 B Data+1 B Parity)

In the ECC2 method, 56 B parity 2 corresponds to (512 B+64 B) data. In the ECC2 method, data of (64 B×4 I/O (32 B)) and parity 2 of (7 B×4 I/O (3.5 B)) are assigned to the 16 banks related to I/O0, I/O2, I/O4 and I/O6 from each page. As can be seen from this, in the ECC2 method, the data and parities are structured as follows:

Data: 512 B Data+64 B Parity 1=(32 B data+4 B parity 1)×16 banks

Parity: 56 B Parity 2=7 b×4 parities 2×16 banks

It should be noted that parity 2 corresponding to 512 B data (P2-0A) of the pages of I/O0, I/O2, I/O4 and I/O6 is stored in the pages of I/O1, I/O3, I/O5 and I/O7. Parity 2 corresponding to 512 B data (P2-0B) related to I/O1, I/O3, I/O5 and I/O7 is stored in the pages of I/O0, I/O2, I/O4 and I/O6. Eight parities 2 {P2-0A, P2-1A, . . . , P2-7A} or {P2-0B, P2-1B, . . . , P2-7B} are assigned to each page.

The third modification described above produces the advantages of the first embodiment. In addition, the third modification is featured in that data and parity 1 and parity 2 are distributedly stored in different groups {I/O0, I/O2, I/O4, I/O6} or {I/O1, I/O3, I/O5, I/O7}. By virtue of this feature, the data damage due to a memory defect caused by long-term use can be distributed.

The first embodiment and the modifications thereof are not limited to the examples described above, and can be modified in various ways. In connection with the above-mentioned embodiment, reference was made to the case where the memory device 200 and the memory controller 300 are made of independent semiconductor chips. However, the memory device 200 and the memory controller 300 may be fabricated as one chip.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
   a memory cell array comprising (i) a plurality of data areas distributedly arranged in a plurality of banks or in a plurality of chips and configured to individually store a plurality of data portions that constitute data of an access unit, and (ii) a plurality of first parity areas adjacent to the data areas and configured to individually store a plurality of first parity portions constituting a first parity corresponding to the data;
   a first command issuing circuit configured to issue a single first command for the data areas and the first parity areas;
   a controller configured to access the data areas and the first parity areas, based on the first command and the access unit;
   a first setting information register configured to store first setting information including (i) a plurality of first combination information representing combinations between sizes of the data areas to be accessed in response to the single first command and sizes of the first parity areas, and (ii) a plurality of codes by which the first combination information are identified; and
   a first code register configured to store one of the codes of the first setting information,
   wherein the controller accesses the data areas and the first parity areas based on the first command and a code stored in the first code register.

2. The memory system according to claim 1, wherein the first command includes a plurality of signals of a first specific pattern shown in a command truth table.

3. The memory system according to claim 2, wherein:
   the signals include a write enable signal, a column address signal and a first unused signal, and
   the first unused signal is used only for providing specific patterns shown in the command truth table.

4. The memory system according to claim 2, wherein the first command is a read command or a write command for the data areas and the first parity areas.

5. The memory system according to claim 1, further comprising:
   a third command issuing circuit configured to issue a single third command for the first parity areas,
   wherein the controller accesses the first parity areas in response to the third command.

6. The memory system according to claim 5, wherein the third command includes a plurality of signals of a third specific pattern shown in a command truth table.

7. The memory system according to claim 6, wherein the signals include a write enable signal and a parity address signal.

8. The memory system according to claim 6, wherein the third command is a read command or a write command for the first parity areas.

9. The memory system according to claim 1, wherein:
   the memory cell array and the controller are fabricated in a first semiconductor chip, and
   the first command issuing circuit is fabricated in a second semiconductor chip different from the first semiconductor chip.

10. The memory system according to claim 1, further comprising:
    a second command issuing circuit,
    wherein the memory cell array further comprises a plurality of second parity areas distributed among a plurality of banks or a plurality of chips and configured to individually store a plurality of second parity portions constituting the second parity corresponding to the data and first parity,
    wherein the second command issuing circuit issues a single second command for the data areas, the first parity areas and the second parity areas, and
    wherein the controller accesses the data areas, the first parity areas and the second parity areas in response to the second command.

11. The memory system according to claim 10, wherein the second command includes a plurality of signals of a second specific pattern shown in a command truth table.

12. The memory system according to claim 11, wherein:
    the signals include a write enable signal, a column address signal and a second unused signal, and
    the second unused signal is used only for providing specific patterns shown in the command truth table.

13. The memory system according to claim 11, wherein the second command is a read command or a write command for the data areas, the first parity areas and the second parity areas.

14. The memory system according to claim 10, further comprising:
    a second setting information register configured to store second setting information including (i) a plurality of second combination information representing combinations between sizes of the data areas to be accessed in response to the single second command and sizes of the second parity areas, and (ii) a plurality of codes by which the second combination information are identified; and
    a second code register configured to store one of the codes of the second setting information,
    wherein the controller accesses the data areas, the first parity areas and the second parity areas, based on the second command and a code stored in the second code register.

* * * * *